US007208393B2

(12) United States Patent
Haskell et al.

(10) Patent No.: US 7,208,393 B2
(45) Date of Patent: Apr. 24, 2007

(54) GROWTH OF PLANAR REDUCED DISLOCATION DENSITY M-PLANE GALLIUM NITRIDE BY HYDRIDE VAPOR PHASE EPITAXY

(75) Inventors: Benjamin A. Haskell, Santa Barbara, CA (US); Melvin B. McLaurin, Goleta, CA (US); Steven P. DenBaars, Goleta, CA (US); James Stephen Speck, Goleta, CA (US); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/140,893

(22) Filed: May 31, 2005

(65) Prior Publication Data
US 2005/0245095 A1 Nov. 3, 2005

Related U.S. Application Data

(63) Continuation-in-part of application No. 11/123,805, filed on May 6, 2005, and a continuation-in-part of application No. PCT/US03/39355, filed on Dec. 11, 2003, and a continuation-in-part of application No. PCT/US03/21918, filed on Jul. 15, 2003, and a continuation-in-part of application No. PCT/US03/21918, filed on Jul. 15, 2003, and a continuation-in-part of application No. 10/413,913, filed on Apr. 15, 2003, now Pat. No. 6,900,070, and a continuation-in-part of application No. 10/413,690, filed on Apr. 15, 2003, and a continuation-in-part of application No. 10/413,691, filed on Apr. 15, 2003.

(60) Provisional application No. 60/576,685, filed on Jun. 3, 2004, provisional application No. 60/569,749, filed on May 10, 2004, provisional application No. 60/433,843, filed on Dec. 16, 2002, provisional application No. 60/433,844, filed on Dec. 16, 2002, provisional application No. 60/372,909, filed on Apr. 15, 2002.

(51) Int. Cl.
*H01L 21/36* (2006.01)
*H01L 21/20* (2006.01)

(52) U.S. Cl. ................ 438/481; 438/479; 257/E21.097

(58) Field of Classification Search ............... 438/481, 438/479, 585, 590, 604, 606, FOR. 475; 257/E21.097, E21.108, E21.119, E21.125
See application file for complete search history.

(56) References Cited

U.S. PATENT DOCUMENTS 5,926,726 A * 7/1999 Bour et al. ............... 438/507

(Continued)

FOREIGN PATENT DOCUMENTS

EP        0 942 459        9/1999

(Continued)

OTHER PUBLICATIONS

Aujol et al, "Hydrogen and Nitrogen Ambient Effects on Epitaxial Growth of GaN by Hydride Vapour Phase Epitaxy", Journal of Crystal Growth, 2001, 230. Pages 372-376.*

(Continued)

*Primary Examiner*—Michelle Estrada
*Assistant Examiner*—Quovaunda Jefferson
(74) *Attorney, Agent, or Firm*—Gates & Cooper LLP

(57) ABSTRACT

A method of growing highly planar, fully transparent and specular m-plane gallium nitride (GaN) films. The method provides for a significant reduction in structural defect densities via a lateral overgrowth technique. High quality, uniform, thick m-plane GaN films are produced for use as substrates for polarization-free device growth.

19 Claims, 8 Drawing Sheets

U.S. PATENT DOCUMENTS

| | | | |
|---|---|---|---|
| 6,051,849 | A | 4/2000 | Davis et al. |
| 6,153,010 | A | 11/2000 | Kiyoku et al. |
| 6,156,581 | A * | 12/2000 | Vaudo et al. .................. 438/22 |
| 6,177,057 | B1 * | 1/2001 | Purdy ......................... 423/409 |
| 6,177,292 | B1 | 1/2001 | Hong et al. |
| 6,180,270 | B1 | 1/2001 | Cole et al. |
| 6,268,621 | B1 | 7/2001 | Emmi et al. |
| 6,350,666 | B2 | 2/2002 | Kryliouk |
| 6,413,627 | B1 | 7/2002 | Motoki et al. |
| 6,441,391 | B1 | 8/2002 | Ohno et al. |
| 6,468,882 | B2 * | 10/2002 | Motoki et al. .............. 438/460 |
| 6,582,986 | B2 | 6/2003 | Kong et al. |
| 6,586,316 | B2 | 7/2003 | Tsuda et al. |
| 6,602,763 | B2 | 8/2003 | Davis et al. |
| 6,623,560 | B2 | 9/2003 | Biwa et al. |
| 6,635,901 | B2 | 10/2003 | Sawaki et al. |
| 6,645,295 | B1 | 11/2003 | Koike et al. |
| 6,900,070 | B2 | 5/2005 | Craven et al. |
| 2001/0029086 | A1 | 10/2001 | Ogawa et al. |
| 2002/0047113 | A1 | 4/2002 | Ohno et al. |
| 2003/0114017 | A1 | 6/2003 | Wong et al. |
| 2004/0108513 | A1 | 6/2004 | Narukawa et al. |

FOREIGN PATENT DOCUMENTS

| | | |
|---|---|---|
| JP | 2001 257166 | 9/2001 |
| JP | 2002 076329 | 3/2002 |
| JP | 2002 076521 | 3/2002 |
| WO | WO 2004/061909 | 7/2004 |
| WO | WO 2004/061969 | 7/2004 |
| WO | WO 2005/064643 | 7/2005 |

OTHER PUBLICATIONS

Waltereit et al, "M-Plane GaN (1100) Grown on g-LiAlO2 (100): Nitride Semiconductors Free of Internal Electrostatic Fields", Journal Of Crystal Growth, 2001, 227-228. Pages 437-441.*

Wang, F. et al., "Crystal Tilting in the Epitaxial Laterally Overgrown GaN Films on Sapphire Substrate by Hydride Vapor Phase Epitaxy", Solid State and Integrated-Circuit Technology Proceedings, 6th International Conference, Oct. 2001, vol. 2, pp. 1998-1201.

Maruska, H.P. et al., "Development of 50 mm Diameter Non-Polar Gallium Nitride Substrates for Device Applications", International Conference on Indium Phosphide and Related Materials, May 16, 2003, pp. 567-570.

Craven, M.D., et al., "Structural characterization of nonpolar (1120) α-plane GaN thin films grown on (1102) r-plane sapphire", Applied Physics Letters, vol. 81, No. 3, Jul. 15, 2002, pp. 469-471, XP002250684.

Dupuis, R.D., et al., "Selective-area and lateral epitaxial overgrowth of III-N materials by metalorganic chemical vapor deposition", Journal of Crystal Growth, vol. 195, No. 1-4, Dec. 15, 1998, pp. 340-345, XP004154285.

Grzegory, I., et al., "Seeded growth of GaN at high $N_2$ pressure on (0 0 0 1) polar surfaces of GaN single crystalline substrates", Materials Science in Semiconductor Processing, vol. 4, No. 6, Dec. 2001, pp. 535-541, XP004345737.

Liu, L. et al., "Substrates for gallium nitride epitaxy", Materials Science and Engineering R, Reports: A Review Journal, vol. 37, No. 3, Apr. 30, 2002, pp. 61-127, XP004349792.

Marchand, H., et al., "Mechanisms of lateral epitaxial overgrowth of gallium nitride by metalorganic chemical vapor deposition", Journal of Crystal Growth, vol. 195, No. 1-4, Dec. 15, 1998, pp. 328-332, XP004154283.

Mills, Alan, "Wide-bandgap emitters continue to improve", III-Vs Review, vol. 13, No. 3, May 2000, pp. 23-24, 26, 28-30, XP004200697.

Sasaki, T., et al., "Substrate-orientation dependence of GaN single-crystal films grown by metalorganic vapor-phase epitaxy", Journal of Applied Physics, American Institute of Physics, vol. 61, No. 7, Apr. 1, 1987, pp. 2533-2540, XP000820119.

Sun, Chien-Jen, et al., "Comparison of the physical properties of GaN thin films deposited on (0001) and (0112) sapphire substrates", Applied Physics Letters, vol. 63, No. 7, 1993, pp. 973-975, XP002251480.

Amano, H., et. al., "Metalorganic vapor phase epitaxial growth of a high quality GaN film using an AlN buffer layer" Appl. Phys. Lett. 48 (5), Feb. 3, 1986, pp. 353-355.

Ambacher, O., et. al., "Two-dimensional electron gases induced by spontaneous and piezoelectric polarization charges in N- and Ga-face AlGaN/GaN heterostructures" J. Appl. Phys., 85 (6), Mar. 15, 1999, pp. 3222-3233.

Bottcher, T., et al., "The role of high-temperature island coalescence in the development of stresses in GaN films" Appl. Phys. Lett. 78 (14), Apr. 2, 2001, pp. 1976-1978.

Brandt, O., et al., "Determination of strain state and composition of highly mismatched group-III nitride heterostructures by x-ray diffraction" J. Phys. D. Appl. Phys. 35 (2002), pp. 577-585.

Craven, M.D., et al., "Characterization of a-Plane GaN/($Al_3Ga$)N Multiple Quantum Wells Grown via Metalorganic Chemical Vapor Deposition" Jpn. J. Appl. Phys. vol. 42, (2003), pp. L235-L238.

Craven, M.D., et al., "Threading dislocation reduction via laterally overgrown nonpolar (1120) a-plane GaN" Appl. Phys. Lett. 81 (7), Aug. 12, 2002, pp. 1201-1203.

Dovidenko, K., et. al., Characteristics of stacking faults in AlN thin films J. Appl. Phys. 82 (9), Nov. 1, 1997, pp. 4296-4299.

Eastman, L.F., "The Toughest Transistor Yet" IEEE Spectrum 39 (5), May 2002, pp. 28-33.

Eddy, C.R., Jr., "Growth of gallium nitride thins films by electron cyclotron resonance microwave plasma-assisted molecular beam epitaxy" J. Appl. Phys. 73 (1), Jan. 1, 1993, pp. 448-455.

Etzkorn, E.V., et al., "Cracking of GaN films" J. Appl. Phys. 89 (2), Jan. 15, 2001, pp. 1025-1034.

Freitas, J. A., Jr., et al., "Optical characterization of lateral epitaxial overgrown GaN layers" Appl. Phys. Lett. 72 (23), Jun. 8, 1998, pp. 2990-2992.

Grandjean, N., et al., "Built-in electric-field effects in wurtzite AlGaN quantum wells" J. Appl. Phys. 86 (7), Oct. 1, 1999, pp. 3714-3720.

Heying, B., et al., "Role of threading dislocation structure on the x-ray diffraction peak widths in epitaxial GaN films" Appl. Phys. Lett. 68 (5), Jan. 29, 1996, pp. 643-645.

I. J. Seo, et. al., "Reduction of oscillator strength due to piezoelectric fields in $GaN/Al_xGa_{1-x}N$ quantum wells" Phys. Rev. B. 57 (16), Apr. 15, 1998-II, pp. R9435-R9438.

Iwata, K., et. al., "Gas Source Molecular Beam Epitaxy Growth of GaN on C–, A–, R–, and M–Plane Sapphire and Silica Glass Substrates" Jpn. J. Appl. Phys. vol. 36 (1997), pp. L 661-L664.

Kapolnek, D., et al., "Anisotropic epitaxial lateral growth in GaN selective area epitaxy" Appl. Phys. Lett. 71 (9), Sep. 1, 1997, pp. 1204-1206.

Langer, R., et. al., "Giant electric fields in unstrained GaN single quantum wells" Appl. Phys. Lett., 74 (25), Jun. 21, 1999, pp. 3827-3829.

Lefebvre, P. et al., "High internal electric field in a graded-width InGaN/GaN quantum well: Accurate determination by time-resolved photoluminescence spectroscopy" Appl. Phys. Lett. 78 (9), Feb. 26, 2001, pp. 1252-1254.

Lefebvre, P., et al., "Time-resolved photoluminescence as a probe of internal electric fields in GaN-(GaAl)N quantum wells" Phys. Rev. B. 59 (23), Jun. 15, 1999-I, pp. 15363-15367.

Lei, T., "Heteroepitaxy, polymorphism, and faulting in GaN thin films on silicon and sapphire substrates" J. Appl. Phys. 74 (7), Oct. 1, 1993, pp. 4430-4437.

Leroux, M., "Barrier-width dependence of group-III nitrides quantum-well transition energies" Phys. Rev. B. 60 (3), Jul. 15, 1991-I, pp. 1496-1499.

Leszczynski, M., et. al., "Lattice parameters of gallium nitride" Appl. Phys. Lett. 69 (1), Jul. 1, 1996, pp. 73-75.

Marchand, H., et al., "Microstructure of GaN laterally overgrown by metalorganic chemical vapor deposition" Appl. Phys. Lett. 73 (6), Aug. 10, 1998, pp. 747-749.

Marchand, H., et al., "atomic force microscopy observation of threading dislocation density reduction in lateral epitaxial overgrowth of gallium nitride by MOCVD" MRS Internet J. Nitride Semicond. Res. 3, 3 (1998), pp. 1-7.

Metzger, Th., et. al., "X-Ray Diffraction Study of Gallium Nitride Grown by MOCVD" Physica status solidi (b) 193, 1996, pp. 391-397.

B. Monemar, et. al., "Properties of Zn-doped VPE-grown GaN.I.Luminescence data in relation to doping conditions" J. Appl. Phys. 51 (1), Jan. 1980, pp. 625-639.

Moustakas, T.D., et. al., "Growth of GaN by ECR-assisted MBE" Physica B 185, 1993, pp. 36-49.

Motoki, J., et al., "Preparation of Large Freestanding GaN Substrates by Hydride Vapor Phase Epitaxy Using GaAs as a Starting Substrate" Jpn. J. Appl. Phys. vol. 40 (2), (2001), pp. L140-L143.

Nakamura, S, et. al., "Violet InGaN/GaN/AlGaN-Based Laser Diodes Operable at 50° C. with a Fundamental Transverse Mode" Jpn. J. Appl. Phys. 38 (2), 1999, pp. L226-L229.

Nam, O., et. al., "Lateral epitaxy of low defect density GaN layers via organometallic vapor phase epitaxy" Appl. Phys. Lett. 71 (18), Nov. 3, 1997, pp. 2638-2640.

Nataf, G., et. al., "Lateral overgrowth of high quality GaN layers on GaN/$Al_2O_3$ patterned substrates by halide vapour-phase epitaxy" J. of Crystal Growth (192), Feb. 20, 1998, pp. 73-78.

Ng, H. M., "Molecular-beam epitaxy of GaN/$Al_xGa_{1-x}N$ multiple quantum wells on R-plane (1012) sapphire substrates" Appl. Phys. Lett. 80 (23), Jun. 10, 2002, pp. 4369-4371.

Nishida, T., et al., "Ten Milliwatt Operation of an AlGaN-Based Light Emitting Diode Grown on GaN Substrate" Phys. Stat. Sol. (a) 188, 2001, pp. 113-116.

Park, S., et. al., "Spontaneous polarization effects in wurtzite GaN/AlGaN quantum wells and comparison with experiment" Appl. Phys. Lett. 76 (15), Apr. 10, 2000, pp. 1981-1983.

Park, J., et. al., "Selective-area and lateral epitaxial overgrowth of III-N materials by metal organic chemical vapor deposition" Appl. Phys. Lett. 73 (3), Jul. 20, 1998, pp. 333-335.

Parilliaud, O., et al., "Localized Epitaxy of GaN by HVPE on patterned Substrates" MRS Internet J. Nitride Semicond. Res. 3 (40), Oct. 19, 1998, pp. 1-9.

Paskova, T., et al., "Defect Reduction in HVPE Growth of GaN and Related Optical Spectra" Phys. Stat. Sol. (a) 183, (2001), pp. 197-203.

Rosner, S.J., et. al., "Cathodoluminescence mapping of epitaxial lateral overgrowth in gallium nitride" Appl. Phys. Lett. 74 (14), Apr. 5, 1999, pp. 2035-2037.

Sakai, A., et al., "Self-organized propagation of dislocations in GaN films during epitaxial lateral overgrowth" Appl. Phys. Lett. 76 (4), Jan. 24, 2000, pp. 442-444.

Sano, M., et al., "Epitaxial Growth of Undoped and Mg-Doped GaN" Jpn. J. of Appl. Phys. 15 (10), Oct. 1976, pp. 1943-1950.

Shintani, A., et al. "Light Emitting Patterns of Gallium Nitride Electroluminescence" J. Electrochem. Soc. 123 (10), Oct. 1976, pp. 1575-1578.

Smorchkova, I.P., et. al., "Polarization-induced charge and electron mobility in AlGaN/GaN heterostructures grown by plasma-assisted molecular-beam epitaxy" J. Appl. Phys. 86 (8), Oct. 15, 1999, pp. 4520-4526.

Takeuchi, T., et al., "Determination of piezoelectric fields in strained GaInN quantum wells using the quantum-confined Stark effect" Appl. Phys. Lett. 73 (12), Sep. 21, 1998, pp. 1691-1693.

Takeuchi, T., et. al., "Quantum-Confined Stark Effect due to Piezoelectric Fields in GaInN Strained Quantum Wells" Jpn. J. Appl. Phys. vol. 36, Apr. 1, 1997, pp. L382-385.

Tan, I-H., et. al., "A self consistent solution of Schrodinger-Poisson equations using a nonuniform mesh" J. Appl. Phys. 68 (8), Oct. 15, 1990, pp. 4071-4076.

Tsuchiya, H., et. al., "Growth condition dependence of GaN crystal structure on (0 0 1)GaAs by hydride vapor-phase epitaxy" J. of Crystal Growth (189/190), 1998, pp. 395-400.

Waltereit, P., et. al., "Nitride semiconductors free of electrostatic fields for efficient white light-emitting diodes" Nature vol. 406, Aug. 24, 2000, pp. 865-868.

Wright, A.F., "Elastic properties of zinc-blende and wurtzite AlN, GaN, and InN" J. Appl. Phys. 82 (6), Sep. 15, 1997, pp. 2833-2839.

Yablonovitch, E., et. al., "Reduction of Lasing Threshold Current Density by the Lowering of Valence Band Effective Mass" J. of Lightwave Tech. vol. LT-4 (5), May 1986, pp. 504-506

Zheleva, T., et. al., "Dislocation density reduction via lateral epitaxy in selectively grown GaN structures" Appl. Phys. Lett. 71 (17), Oct. 27, 1997, pp. 2472-2474.

Zheleva, T., et. al., "Pendo-epitaxy- A new approach for lateral growth of gallium nitride structures" MRS Internet J. Nitride Semicond. Res. 4S1, G3.38 (1999).

Yu., Z., et. al., "Epitaxial lateral overgrowth of GaN on SiC and sapphire substrates" MRS Internet J. Nitride Semicond. Res. 4S1, G4.3 (1999).

Kinoshita et al., "Emission Enhancement of GaN/AlGaN Single-Quantum-Wells Due to Screening of Piezoelectric Field", MRS Internet J. Nitride Semicond. Res. 5, W11.32 (2000).

Leroux et al., "Quantum confined Stark effect due to built-in internal polarization fields in (Al,Ga)N/GaN quantum wells", Phys. Rev. B 58, R113371 (1998).

Kuokstis et al., "Polarization effects in photoluminescence of C- and M-plane GaN/AlGaN multiple quantum wells", Appl. Phys. Lett. 81, 4130 (2002).

Bhattacharyya et la., "Comparative study of GaN/AlGaN MQWs grown homoepitaxially on (1 1 0 0) and (0001) GaN", Crystal Growth 251, 487 (2003).

Bernardini et al., "Spontaneous polarization and piezoelectric constants of III-V nitrides", Phys. Rev. B 56, R10024 (1997).

Langer et al., "Giant electric fields in unstrained GaN single quantum wells", Appl. Phys. Lett. 74, 3827 (1999).

Traetta et al., "Effects of the spontaneous polarization and piezoelectric fields on the luminescence spectra of GaN/Al$_{0.15}$Ga$_{0.85}$N quantum wells", Physica E 7, 929-933 (2000).

Keller et al., "Metalorganic Chemical Vapor Deposition Growth of High Optical Quality and High Mobility GaN", J. Electronic Materials vol. 24, pp. 1707-1709 (1995).

Chakraborty et al., "Nonpolar InGaN/GaN emitters on reduced-defect lateral epitaxially overgrown a-plane GaN with drive-current-independent electroluminescence emission peak", Applied Physics Letters vol. 85 No. 22, (Nov. 29, 2004).

Chitnis et al., "Visible light-emitting diodes using a-plane GaN—InGaN multiple quantum wells over r-plane sapphire", Applied Physics Letters vol. 84 No. 18 (May 3, 2004).

Gardner et al., "Polarization anisotropy in the electroluminescence of m-plane InGaN—GaN multiple-quantum-well light-emitting diodes", Applied Physics Letters 86, 111101 (2005).

Vanfleet et al., "Defects in m-face GaN films grown in halide vapor phase epitaxy on LiAlO$_2$", Applied Physics Letters, vol. 83, No. 6 (Aug. 11, 2003).

Haskell et al., "Defect reduction in (1120) a-plane gallium nitride via lateral epitaxial overgrowth by hydride vapor-phase epitaxy", Applied Physics Letters, vol. 83 No. 4 (Jul. 28, 2003).

Yue Jun Sun et al., "In surface segregation in M-plane (In,Ga)N/GaN multiple quantum well structures", Applied Physics Letters, vol. 83 No. 25 (Dec. 22, 2003).

Bigenwald et al., "Confined Excitons in GaN—AlGaN Quantum Wells", Phys. Stat. Sol. (b) 216, 371 (1999).

Im, J.S. et al., "Reduction of oscillator strength due to piezoelectric fields in GaN/Al$_x$Ga$_{1-x}$N quantum wells", Phys. Rev. B, vol. 57 No. 16 (Apr. 15, 1998).

Nam, Ok-Hyun et al., "Lateral epitaxy of low defect density GaN layers via organometallic vapor phase epitaxy", Appl. Phys. Lett. 71 (18) (Nov. 3, 1997).

Zheleva et al., "Dislocation density reduction via lateral epitaxy in selectively grown GaN structures", Appl. Phys. Lett. 71 (17) (Oct. 27, 1997).

Yue Jun Sun et al., "Nonpolar In$_x$Ga$_{1-x}$N/GaN(1100) multiple quantum wells grown on γ-LiAlO$_2$(100) by plasma-assisted molecular-beam epitaxy", Physical Review B 67 (2003).

Takeuchi et al., "Theoretical Study of Orientation Dependence of Piezoelectric Effects in Wurtzite Strained GaInN/GaN Heterostructures and Quantum Wells", Jpn. J. Appl. Phys. vol. 39, pp. 413-416, Part 1, No. 2A (Feb. 2000).

Grandjean et al., "Self-limitation of AlGaN/GaN quantum well energy by build-in polarization field", Applied Physics Letters, vol. 74, No. 16 (Apr. 19, 1999).

Amano et la., "Stress and Defect Control in GaN Using Low Temperature Interlayers", Jpn. J. Appl. Phys., vol. 37 (1998).

Mukai et al., "Ultraviolet InGaN and GaN Single-Quantum-Well-Structure Light-Emitting Diodes Grown on Epitaxially Laterally Overgrown GaN Substrates", Jpn. J. Appl. Phys., vol. 38, pp. 5735-5739 (1999).

Miller et al., "Electric field dependence of optical absorption near the band gap of quantum-well structures", The American Physical Society, Physical Review B, vol. 32, No. 2 (Jul. 15, 1985).

Pearton et al., "GaN: Processing defects, and devices", Applied Physics Reviews, Journal of Applied Physics, vol. 86, No. 1 (Jul. 1, 1999).

S. Nakamura and G. Fasol, The Blue Laser Diode, (Springer, Heidelberg, 1997), pp. 160-178.

T. Gehrke et al., "Pendeo-Epitaxy of Gallium Nitride and Aluminum Nitride Films and Heterostructure on Silicon Carbide Substrate," MRS Internet J. Semicond. Res. 4S1, G3.2, 1999, 6 pp.

M. Iwaya et al., "Reduction of Etch Pit Density in Organometallic Vapor Phase Epitaxy-Grown GaN on Sapphire by Insertion of a Low-Temperature-Deposited Buffer Layer Between High-Temperature-Grown GaN," Jpn. J. Appl. Phys., 1998, 37: L316-L318.

S. Keller et al., "Spiral Growth of InGaN Nanoscale Islands on GaN," Jpn. J. Appl. Phys., 1998, 37: L431-L434.

P. Kozodoy et al., "Electrical Characterization of GaN $p$—$n$ Junctions With and Without Threading Dislocations," Appl. Phys. Lett., 1998, 73(7): 975-977.

S. Nakamura et al., "InGaN/GaN/AIGaN-Based Laser Diodes with Modulation-Doped Strained-Layer Superlattices Grown on an Epitaxially Laterally Overgrown GaN Substrate," Appl. Phys. Lett., 1998, 72(2): 211-213.

G. Parish et al., "High-Performance (AI,Ga) N-Based Solar-Blind Ultraviolet $p$-$i$-$n$ Detectors on Laterally Epitaxially Overgrown GaN," Appl. Phys. Lett., 1999, 75(2): 247-249.

V. Srikant et al., "Mosaic Structure in Epitaxial Thin Films Having Large Lattice Mismatch," J. Appl. Phys., 1997, 82(9): 4286-4295.

S. Tanaka et al., "Anti-Surfactant in III-Nitride-Epitaxy—Quantum Dot Formation and Dislocation Termination," Jpn. J. Appl. Phys., 2000, 39: L831-L834.

S. Tanaka et al., "Self-Assembling GaN Quantum Dots on Al$_x$Ga$_{1-x}$N Surfaces Using a Surfactant," Appl. Phys. Lett., 1996, 69(26): 4096-4098.

A. Usui et al., "Thick GaN Epitaxial Growth with Low Dislocation Density by Hydride Vapor Phase Epitaxy," Jpn. J. Appl. Phys., 1997, 36: L899-L902.

Amano, H. et al., "Stress and Defect Control in GaN Using Low Temperature Interlayers," Jpn. J. Appl. Phys. vol. 37 (1998), pp. L 1540-L 1542.

* cited by examiner

GROWTH OF PLANAR REDUCED DISLOCATION DENSITY M-PLANE GALLIUM NITRIDE BY HYDRIDE VAPOR PHASE EPITAXY

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/576,685, filed on Jun. 3, 2004, by Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,"

which application is incorporated by reference herein.

This application is a continuation-in-part and claims the benefit under 35 U.S.C. Sections 119, 120 and/or 365 of the following co-pending and commonly-assigned patent applications:

International Patent Application No. PCT/US03/21918, filed Jul. 15, 2003, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY," which application claims priority to U.S. Provisional Patent Application Ser. No. 60/433,843, filed Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY,"

International Patent Application No. PCT/US03/21916, filed Jul. 15, 2003, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY," which application claims priority to U.S. Provisional Patent Application Ser. No. 60/433,844, filed Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY,"

U.S. patent application Ser. No. 10/413,691, filed Apr. 15, 2003, by Michael D. Craven and James S. Speck, entitled "NON-POLAR A-PLANE GALLIUM NITRIDE THIN FILMS GROWN BY METALORGANIC CHEMICAL VAPOR DEPOSITION," which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,"

U.S. patent application Ser. No. 10/413,690, filed Apr. 15, 2003, by Michael D. Craven, Stacia Keller, Steven P. DenBaars, Tal Margalith, James S. Speck, Shuji Nakamura, and Umesh K. Mishra, entitled "NON-POLAR (Al,B,In,Ga)N QUANTUM WELL AND HETEROSTRUCTURE MATERIALS AND DEVICES, which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,"

U.S. patent application Ser. No. 10/413,913, filed Apr. 15, 2003, by Michael D. Craven, Stacia Keller, Steven P. DenBaars, Tal Margalith, James S. Speck, Shuji Nakamura, and Umesh K. Mishra, entitled "DISLOCATION REDUCTION IN NON-POLAR GALLIUM NITRIDE THIN FILMS," which application claims priority to U.S. Provisional Patent Application Ser. No. 60/372,909, filed Apr. 15, 2002, by Michael D. Craven, Stacia Keller, Steven P. DenBaars, Tal Margalith, James S. Speck, Shuji Nakamura, and Umesh K. Mishra, entitled "NON-POLAR GALLIUM NITRIDE BASED THIN FILMS AND HETEROSTRUCTURE MATERIALS,"

International Patent Application No. PCT/US03/39355, filed Dec. 11, 2003, by Michael D. Craven and Steven P. DenBaars, entitled "NONPOLAR (Al, B, In, Ga)N QUANTUM WELLS," which application is a continuation-in-part of the above Patent Application Nos. PCT/US03/21918 (30794.93-WO-U1), PCT/US03/21916 (30794.94-WO-U1), 10/413,691 (30794.100-US-U1), 10/413,690 (30794.101-US-U1), 10/413,913 (30794.102-US-U1); and U.S. patent application Ser. No. 11/123,805, filed May 6, 2005, by Arpan Chakraborty, Benjamin A. Haskell, Stacia Keller, James S. Speck, Steven P. DenBaars, Shuji Nakamura, and Umesh K. Mishra, entitled "FABRICATION OF NONPOLAR INDIUM GALLIUM NITRIDE THIN FILMS, HETEROSTRUCTURES AND DEVICES BY METALORGANIC CHEMICAL VAPOR DEPOSITION," which application claims priority to U.S. Provisional Patent Application Ser. No. 60/569,749, filed May 10, 2004, by Arpan Chakraborty, Benjamin A. Haskell, Stacia Keller, James S. Speck, Steven P. DenBaars, Shuji Nakamura, and Umesh K. Mishra, entitled "FABRICATION OF NONPOLAR INGAN THIN FILMS, HETEROSTRUCTURES AND DEVICES BY METALORGANIC CHEMICAL VAPOR DEPOSITION,"

all of which applications are incorporated by reference herein.

BACKGROUND OF THE INVENTION

1. Field of the Invention

The present invention is related to compound semiconductor growth and device fabrication. More particularly the invention relates to the growth and fabrication of planar, m-plane gallium nitride (GaN) films by performing a direct growth of the planar m-plane GaN films by hydride vapor phase epitaxy, optionally followed by a lateral epitaxial overgrowth of the GaN films to achieve reduced dislocation density.

2. Description of the Related Art (Note: The specification of this application references various publications. The full citation of each of these publications can be found below in the section entitled "References." Each of these publications is incorporated by reference herein.)

The usefulness of gallium nitride (GaN) and its ternary and quaternary compounds incorporating aluminum and indium (AlGaN, InGaN, AlInGaN) has been well established for fabrication of visible and ultraviolet optoelectronic devices and high-power electronic devices. These devices are typically grown epitaxially by growth techniques including molecular beam epitaxy (MBE), metalorganic chemical vapor deposition (MOCVD), or hydride vapor phase epitaxy (HVPE).

GaN and its alloys are most stable in the hexagonal würtzite crystal structure, in which the structure is described by two (or three) equivalent basal plane axes that are rotated 120° with respect to each other (the a-axes), all of which are perpendicular to a unique c-axis. FIG. 1 is a schematic of a generic hexagonal würtzite crystal structure 100 and planes of interest 102, 104, 106, 108 with these axes 110, 112, 114, 116 identified therein, wherein the fill patterns are intended to illustrate the planes of interest 102, 104 and 106, but do not represent the materials of the structure 100. Group III and nitrogen atoms occupy alternating c-planes along the crystal's c-axis. The symmetry elements included in the würtzite structure dictate that III-nitrides possess a bulk spontaneous polarization along this c-axis. Furthermore, as the würtzite crystal structure is non-centrosymmetric, würtzite nitrides can and do additionally exhibit piezoelectric polarization, also along the crystal's c-axis. Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One possible approach to eliminating the spontaneous and piezoelectric polarization effects in GaN optoelectronic devices is to grow the devices on non-polar planes of the crystal. Such planes contain equal numbers of Ga and N atoms and are charge-neutral. Furthermore, subsequent non-polar layers are equivalent to one another so the bulk crystal will not be polarized along the growth direction. Two such families of symmetry-equivalent non-polar planes in GaN are the {11$\bar{2}$0} family, known collectively as a-planes, and the {1$\bar{1}$00} family, known collectively as m-planes.

Indeed, (Al,Ga,In,B)N quantum-well structures employing nonpolar growth directions, e.g. the <11$\bar{2}$0> a-direction or <1$\bar{1}$00> m-direction, have been shown to provide an effective means of eliminating polarization-induced electric field effects in würtzite nitride structures since the polar axis lies within the growth plane of the film, and thus parallel to heterointerfaces of quantum wells. In the last few years, growth of nonpolar (Al,Ga,In)N has attracted great interest for its potential use in the fabrication of nonpolar electronic and optoelectronic devices. Recently, nonpolar m-plane AlGaN/GaN quantum wells grown on lithium aluminate substrates via plasma-assisted MBE and nonpolar a-plane AlGaN/GaN multi-quantum wells (MQWs) grown by both MBE and MOCVD on r-plane sapphire substrates showed the absence of polarization fields along the growth direction. More recently, Sun et al. [Sun et al., Appl. Phys. Lett. 83 (25) 5178 (2003)], and Gardner et al. [Gardner et al., Appl. Phys. Lett. 86, 111101 (2005)], heteroepitaxialy grew m-plane InGaN/GaN quantum well structures by MBE and MOCVD, respectively. Chitnis et al. [Chitnis et al., Appl. Phys. Lett. 84 (18) 3663 (2004)], grew a-plane InGaN/GaN structures by MOCVD. Most significantly, researchers at UCSB [Chakraborty et al., Appl. Phys. Lett. 85 (22) 5143 (2004)] very recently demonstrated the significant benefits of growth of reduced defect density a-plane InGaN/GaN devices utilizing low defect-density HVPE grown a-plane GaN templates. This body of literature has established that nonpolar III-nitride light emitting diodes (LEDs) and laser diodes (LDs) have the potential to perform significantly better compared to their polar counterparts.

Bulk crystals of GaN are not available so it is not possible to simply cut a crystal to present a surface for subsequent device regrowth. All GaN films are initially grown heteroepitaxially, i.e. on foreign substrates that provide a reasonable lattice match to GaN. In recent years, a number of groups have found it possible to utilize HVPE as a means of heteroepitaxially depositing GaN films that are thick enough (>200 µm) to remove the foreign substrate, yielding a free-standing GaN substrate that may then be used for homoepitaxial device regrowth. HVPE has the advantage of growth rates that are one to two orders of magnitude greater than that of MOCVD and as many as three orders of magnitude greater than MBE, an advantage that makes it an attractive technique for substrate fabrication.

One significant disadvantage of heteroepitaxial growth of nitrides is that structural defects are generated at the interface between the substrate and epitaxial film. The two predominant types of extended defects of concern are threading dislocations and stacking faults. The primary means of achieving reduced dislocation and stacking fault densities in polar c-plane GaN films is the use of a variety of lateral overgrowth techniques, including lateral epitaxial overgrowth (LEO, ELO, or ELOG), selective area epitaxy, and PENDEO® epitaxy. The essence of these processes is to block or discourage dislocations from propagating perpendicular to the film surface by favoring lateral growth over vertical growth. These dislocation-reduction techniques have been extensively developed for c-plane GaN growth by HVPE and MOCVD.

Only recently have GaN lateral growth techniques been demonstrated for a-plane films. Craven, et al. [Craven et al., Appl. Phys. Lett. 81 (7) 1201 (2002)], succeeded in performing LEO using a dielectric mask on a thin a-plane GaN template layer via MOCVD. Our group [Haskell et al., Appl. Phys. Lett. 83 (4) 644 (2003)] subsequently developed a LEO technique for the growth of a-plane GaN by HVPE. However, to date no such process has been developed or demonstrated for m-plane GaN.

The present invention overcomes these challenges and for the first time provides a technique for the growth of high-quality m-plane GaN by HVPE.

SUMMARY OF THE INVENTION

The present invention provides a method of growing highly planar, fully transparent and specular m-plane GaN films. The method provides for a significant reduction in structural defect densities via a lateral overgrowth technique. High quality, uniform, thick m-plane GaN films are produced for use as substrates for polarization-free device growth.

BRIEF DESCRIPTION OF THE DRAWINGS

Referring now to the drawings in which like reference numbers represent corresponding parts throughout:

FIGS. 8(a), 8(b), and 8(c) are 5×5 μm atomic force micrographs of m-plane GaN surfaces, wherein FIG. 8(a) shows a surface grown using the technique described in the first portion of this disclosure without defect reduction, and FIGS. 8(b) and 8(c) show surfaces from wings of lateral epitaxial overgrown m-plane GaN film grown with the present invention.

DETAILED DESCRIPTION OF THE INVENTION

Figure 1:
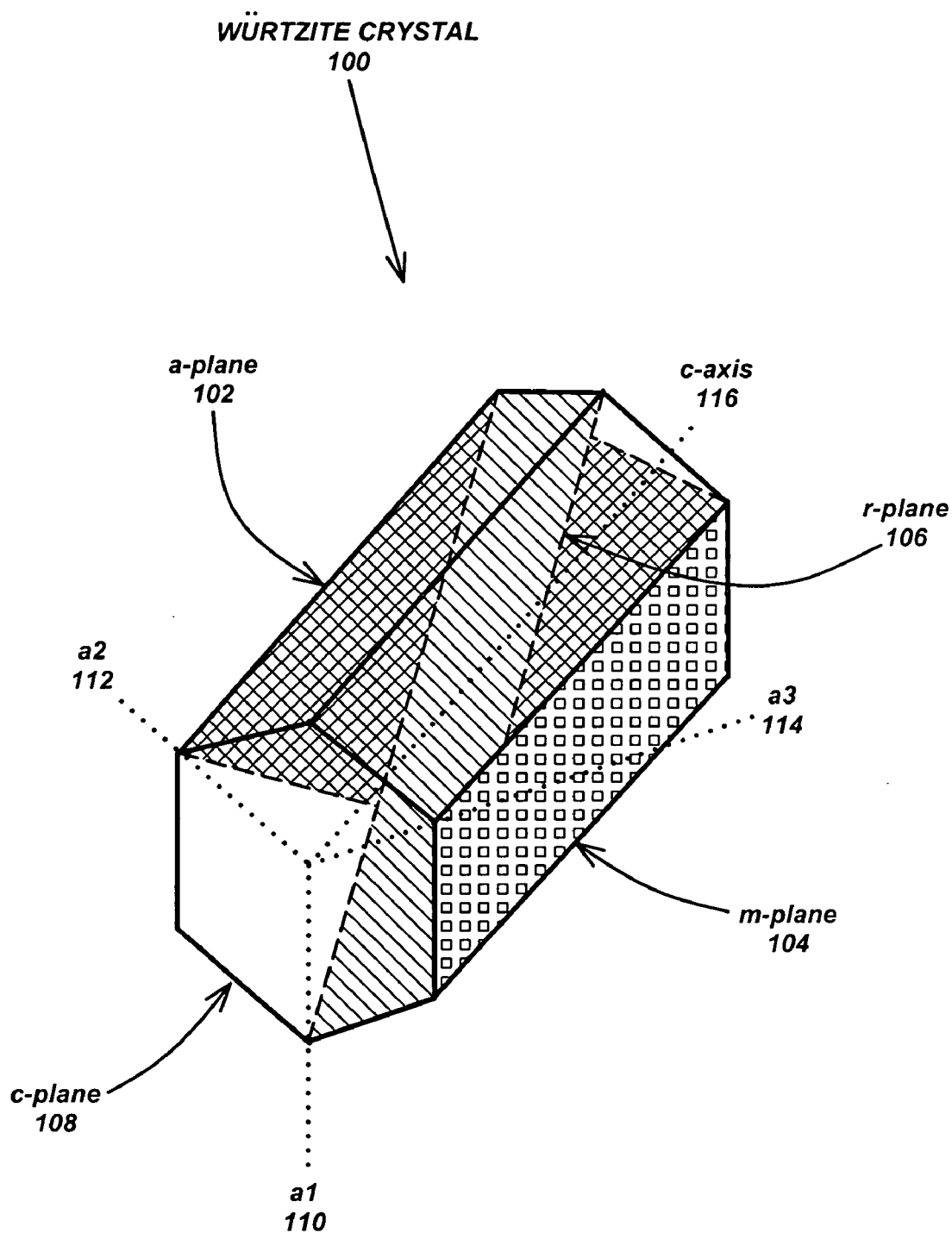
FIG. 1 is a schematic of a generic hexagonal crystal structure and crystal planes of interest.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

Growth of non-polar m-plane {1$\bar{1}$00} nitride semiconductors offers a means of eliminating polarization effects in würtzite-structure III:nitride device structures. Current (Ga,Al,In,B)N devices are grown in the polar [0001] c-direction, which results in charge separation along the primary conduction direction in optoelectronic devices. The resulting polarization fields are detrimental to the performance of current state of the art devices. Growth of these devices along a non-polar direction could improve device performance significantly.

Previous efforts to grow thick films of m-plane GaN yielded highly defective epilayers, containing high densities of bulk defects such as pits, notches, and cracks. These films also were extremely inhomogeneous and unsuitable for use as substrates in homoepitaxial device layer regrowth. This invention solves previously observed problems in the growth of thick non-polar m-plane GaN films, including the elimination of pits, V-shaped defects, arrowhead defects, threading dislocations, and stacking faults. The present invention demonstrates, for the first time, the feasibility of growing highly planar, fully transparent and specular m-plane GaN films. Furthermore, this invention provides for a significant reduction in structural defect densities via a lateral overgrowth technique. This invention allows for the first time high quality, uniform, thick m-plane GaN films to be produced for use as substrates for polarization-free device growth.

The present invention provides a comparatively simple means of producing high-quality, low-defect density non-polar m-plane {1$\bar{1}$00} GaN. Presently, GaN films must be grown heteroepitaxially due to the unavailability of bulk crystals, and no perfectly lattice-matched substrates exist for this growth process. As a result of the lattice mismatch in conventional heteroepitaxial growth, the resulting GaN films are inherently defective, generally containing dislocation densities in excess of $10^8$ cm$^{-2}$. A class of growth techniques that utilize lateral overgrowth has been developed for c-plane (0001) and more recently for a-plane {11$\bar{2}$0} GaN growth, allowing significant reduction in dislocation density. The present invention offers a substantial improvement in film quality for m-plane GaN epilayers grown on foreign substrates, and additionally provides the first-ever successful execution of lateral overgrowth of m-plane GaN by any growth technique. As a result of this invention, it is now possible to grow significantly reduced-defect density, thick non-polar m-plane GaN films that may be subsequently used for the growth of improved electronic and optoelectronic devices by a variety of growth techniques.

Technical Description

The present invention provides a method for the fabrication of planar m-plane GaN films and free-standing layers via HVPE. By utilizing reduced growth pressures and a carrier gas containing a fraction of hydrogen, the present invention has demonstrated the stabilization and growth of nonpolar m-plane GaN directly off of a foreign substrate. The present invention further offers a method for reducing the threading dislocation and stacking fault densities in m-plane GaN through lateral overgrowth from a substrate through a mask layer.

Direct Growth of Planar m-plane GaN

The present invention provides for the direct growth of planar m-plane GaN films by HVPE for the first time. The growth process resembles that for a-plane GaN growth described in International Patent Application No. PCT/US03/21916, filed Jul. 15, 2003, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NON-POLAR A-PLANE GALLIUM NITRIDE BY HYDRIDE VAPOR PHASE EPITAXY," which application claims priority to U.S. Provisional Patent Application Ser. No. 60/433,844, filed Dec. 16, 2002, by Benjamin A. Haskell, Paul T. Fini, Shigemasa Matsuda, Michael D. Craven, Steven P. DenBaars, James S. Speck, and Shuji Nakamura, entitled "TECHNIQUE FOR THE GROWTH OF PLANAR, NON-POLAR A-PLANE GALLIUM NITRIDE BY HYDRIDE VAPOR PHASE EPITAXY," both of which applications are incorporated by reference herein.

This invention applies to a variety of growth sequences for the fabrication of {1$\bar{1}$00} GaN by HVPE. Conventional metal-source HVPE involves the reaction of a halide compound, such as (but not limited to) gaseous hydrogen chloride (HCl), with metallic gallium at a temperature in excess of 700° C., to form gallium monochloride (GaCl). The GaCl is transported to a substrate by a carrier gas, generally nitrogen, hydrogen, helium, or argon. Either in transport to the substrate, at the substrate, or in the exhaust stream, the GaCl reacts with ammonia (NH$_3$), forming GaN. Reactions that occur at the substrate have the potential to yield GaN on the substrate/growing film surface, resulting in crystal growth.

The present invention relies on the use of a combination of several growth parameters to achieve planar GaN films:

1. The use of a suitable substrate, such as, but not limited to, m-plane 6H—SiC, m-plane 4H—SiC, (100) γ-LiAlO$_2$, or any of the aforementioned substrates covered by an m-(In, Al,Ga,B)N template layer. The present invention has been successfully demonstrated with all of these substrates.

2. Use of a fraction of hydrogen (H$_2$) as a carrier gas for the final growth stage in one or more of the gas streams in the reactor;

3. A reduced reactor pressure, below atmospheric pressure (760 Torr), for the final step/stage of film deposition.

Process Steps

Figure 2:
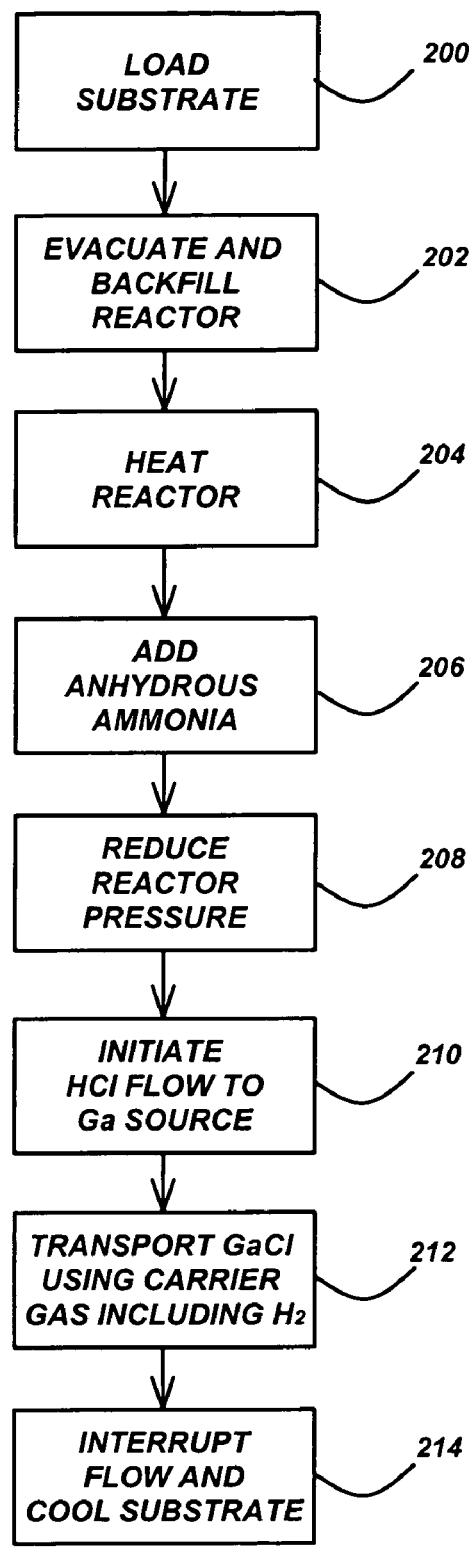
FIG. 2 is a flowchart that illustrates the steps of performing a direct growth of planar m-plane GaN films by hydride vapor phase epitaxy according to the preferred embodiment of the present invention.

FIG. 2 is a flowchart that illustrates the steps of performing a direct growth of planar m-plane GaN films by hydride vapor phase epitaxy according to the preferred embodiment of the present invention. These steps comprise a typical growth sequence that yields high-quality, planar, m-plane GaN films using a conventional three-zone horizontal directed-flow HVPE system. The precise sequence will vary depending on the choice of substrate as described below.

Block 200 represents the step of loading a substrate into a reactor without any ex situ cleaning. In the preferred embodiment, the substrate is an m-plane 6H—SiC, m-plane 4H—SiC, or (100) γ-LiAlO$_2$ substrate, or any of the aforementioned substrates covered by an m-(In,Al,Ga,B)N template layer.

Block 202 represents the step of evacuating the reactor and backfilling the reactor with purified nitrogen (N$_2$) gas to reduce oxygen and water vapor levels therein, before heating the reactor. This step is typically repeated to further reduce the oxygen and water vapor presence in the system.

Block 204 represents the step of heating the reactor to a growth temperature of approximately 1040° C., with a mixture of H$_2$ and N$_2$ flowing through all channels in the system. If the substrate is coated with an m-plane (In,Al,Ga,B)N template layer, it is generally desirable to include a fraction of NH$_3$ in the gas stream during the reactor heating stage to prevent decomposition of the template. Also, when a template layer is used, superior film quality may be achieved by executing block 208, the pressure reduction step, prior to block 204.

Block 206 represents the step of nitridating the substrate, once the reactor reaches the growth temperature, wherein the nitridating step comprises adding anhydrous ammonia (NH$_3$) to a gas stream in the reactor to nitridate the surface of the substrate. The step of nitridating the substrate is performed at a temperature in excess of 900° C. This step is highly desirable when using LiAlO$_2$ substrates, but generally undesirable when using SiC substrates and may be omitted when SiC substrates are used.

Block 208 represents the step of reducing the reactor's pressure to a desired deposition pressure. In the preferred embodiment, the desired deposition pressure is below atmospheric pressure (760 Torr), and more specifically, the desired deposition pressure ranges from 5 to 100 Torr. In the preferred embodiment, the desired deposition pressure is approximately 76 Torr.

Block 210 represents the step of initiating a gaseous hydrogen chloride (HCl) flow to a gallium (Ga) source to begin growth of the m-plane GaN film directly on the substrate without the use of any low-temperature buffer or nucleation layers. Conventional metal source HVPE involves an in situ reaction of a halide compound, such as (but not limited) to, gaseous HCl with the metallic Ga at a temperature in excess of 700° C. to form a metal halide species, such as gallium monochloride (GaCl).

Block 212 represents the step of transporting the GaCl to the substrate by a carrier gas that includes at least a fraction of hydrogen (H$_2$) in one or more of the gas streams in the reactor. The carrier gas may also include nitrogen, helium, or argon, or other non-reactive noble gases. Either in transport to the substrate, at the substrate, or in an exhaust stream, the GaCl reacts with the NH$_3$ to form the GaN film. Reactions that occur at the substrate have the potential to yield the GaN film on the substrate, thereby resulting in crystal growth. Typical V/III ratios (the molar ratio of NH$_3$ to GaCl) are 1–50 for this process. Note that the NH$_3$/HCl ratio need not equal the V/III ratio due to supplemental HCl injection downstream of the Ga source or incomplete reaction of HCl with the Ga source.

Block 214 represents, after a desired growth time has elapsed, the step of interrupting the gaseous HCl flow, returning the reactor pressure, and reducing the reactor's temperature to room temperature. The interrupting step further comprises including NH$_3$ in a gas stream to prevent decomposition of the GaN film during the reduction of the reactor's temperature. The reactor pressure may be returned to atmospheric pressure or held at a lower pressure, e.g., wherein the cooling is performed between 5 and 760 Torr.

Typical growth rates for the GaN film range from 1 to 400 μm per hour by this process. These growth rates are dependent on a number of growth parameters, including, but not limited to, the source and substrate temperatures, flow rates of the various gases into the system, the reactor geometry, etc., and can be varied over reasonably wide ranges while still yielding planar m-plane GaN films. The preferred values for most of these parameters will be specific to the growth reactor geometry.

The reference in the process steps above to the "final growth stage" refers to the observation that it is possible to planarize otherwise rough or defective films by concluding the growth stage with a step of suitable duration using the above-described conditions. The earlier stages of growth may incorporate any growth parameters that yield nominally m-plane oriented material, regardless of film quality or morphology.

Preferably, the above process steps create a planar, m-plane GaN film. Moreover, devices manufactured using this method include laser diodes, light-emitting diodes and transistors.

Experimental Results

Figure 3B:
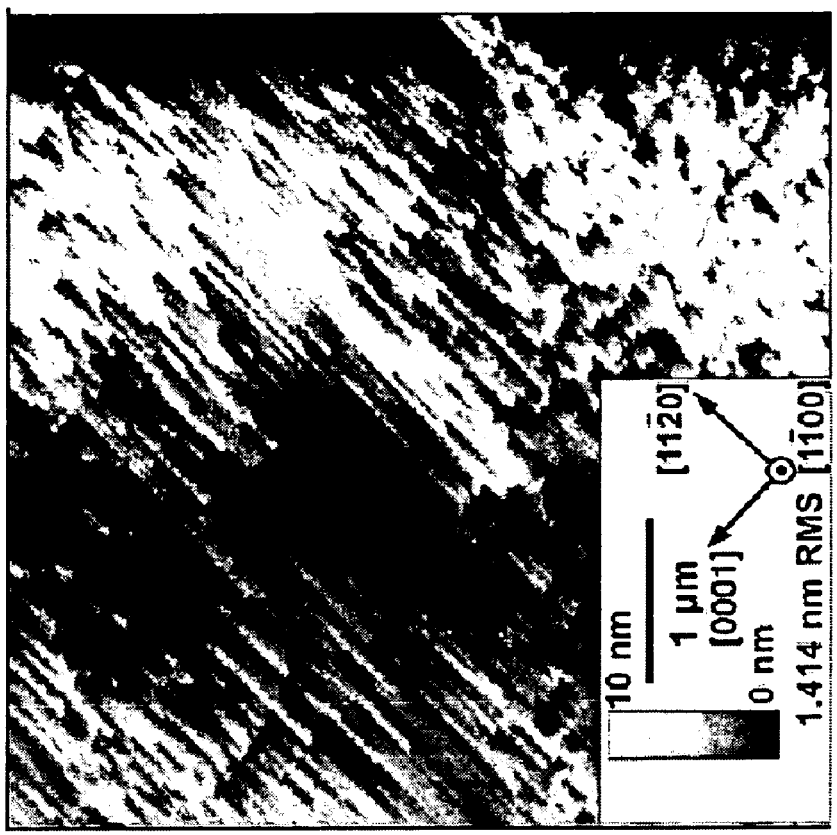
FIG. 3(b) is an atomic force micrograph of the same surface.
Figure 3A:
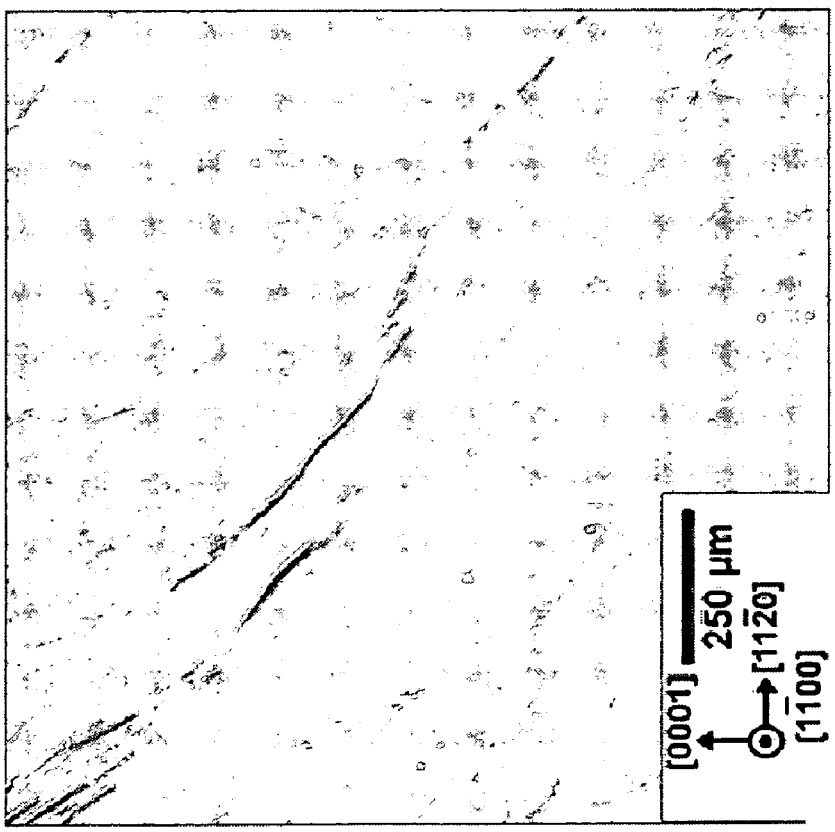
FIG. 3(a) is a Nomarski optical contrast micrograph of an m-plane GaN film grown on a LiAlO$_2$ substrate, demonstrating the uniform and smooth surface morphology achieved with the present invention.

The combination of the above-identified growth parameters has consistently yielded planar m-plane GaN films. FIG. 3(a) shows a Nomarski optical contrast micrograph of an m-plane GaN film grown on a (100) γ-LiAlO$_2$ substrate. This sample was grown using 32% N$_2$, 58% H$_2$, and the balance NH$_3$ and HCl with a V:III ratio of 15.8. The growth pressure was 70 Torr, and the substrate temperature was 862° C. The image is free of bulk defects, such as pits and cracks, that are characteristic of m-plane GaN films previously grown without this invention. The surface exhibits a non-crystallographic, flowing morphology with small nanometer-scale undulations. FIG. 3(b) shows an atomic force micrograph (AFM) image of this same sample. The striated morphology is commonly observed in MBE-grown m-plane GaN films, although this surface is markedly smoother than any previously reported. The scalloped morphology in the lower right quadrant of the AFM image has not previously been reported in the literature. This morphology may be related to the presence of screw-character threading dislocations in the film. The root-mean-square (RMS) roughness of this surface is 14.1 Å over a 25 µm² area, comparable to a-plane GaN films grown on r-plane $Al_2O_3$ by the same technique.

Lateral Epitaxial Overgrowth of m-plane GaN

The above described technique offers the first means to grow planar m-plane GaN films by HVPE. However, while these films are smooth and flat, they still contain a high density of threading dislocations and basal plane stacking faults. Indeed, transmission electron microscopy (TEM) of such direct growth samples has established that the threading dislocation and stacking fault densities are $4 \times 10^9$ cm$^{-2}$ and $2 \times 10^5$ cm$^{-1}$, respectively. The presence of such structural defects will degrade device performance compared to that which may be achieved using reduced defect density m-plane GaN. The present invention further includes a method for reducing the structural defect density in m-plane GaN films via LEO.

The present invention follows closely the technique developed for defect reduction in a-plane GaN films disclosed in International Patent Application No. PCT/US03/21918, filed Jul. 15, 2003, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY," which application claims priority to U.S. Provisional Patent Application Ser. No. 60/433,843, filed Dec. 16, 2002, by Benjamin A. Haskell, Michael D. Craven, Paul T. Fini, Steven P. DenBaars, James S. Speck, and Shuji Nakamura, entitled "GROWTH OF REDUCED DISLOCATION DENSITY NON-POLAR GALLIUM NITRIDE BY HYDRIDE VAPOR PHASE EPITAXY," both of which applications are incorporated by reference herein.

The present invention relies on several key elements:

1. The use of a suitable substrate or template, such as, but not limited to, an m-plane GaN template grown on an AlN buffer layer on m-plane SiC.

2. Deposition of a porous mask on the template or substrate. This mask may be either uniform, as in the deposition and patterning of a dielectric layer; or inhomogeneous, as in the case of the deposition of a thin, porous metallic or ceramic mask. The mask may be deposited by a variety of in situ or ex situ techniques.

3. Deposition of (Al,B,In,Ga)N at a reduced pressure (less than 760 Torr).

4. Use of a majority of $H_2$ in the gas stream to which the substrate/template is exposed during the growth.

Process Steps

Figure 4:
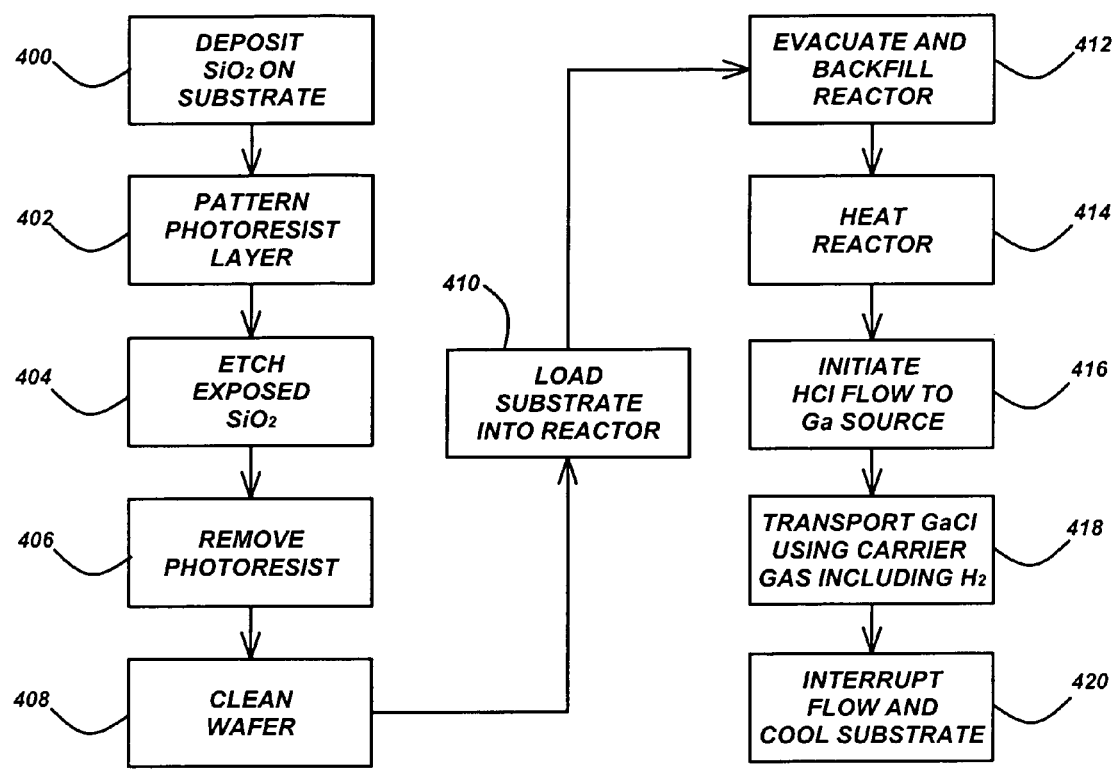
FIG. 4 is a flowchart that illustrates the steps of reducing threading dislocation and defect densities in the planar m-plane GaN films through a lateral epitaxial overgrowth of the GaN films according to the preferred embodiment of the present invention.

FIG. 4 is a flowchart that illustrates the steps of reducing threading dislocation and defect densities in the planar m-plane GaN films through a lateral epitaxial overgrowth of the GaN films according to the preferred embodiment of the present invention. These steps comprise patterning a mask deposited on a substrate (Blocks 400–408 below), and performing a LEO growth of the GaN film off the substrate using HVPE (Blocks 410–420 below), wherein the GaN film nucleates only on portions of the substrate not covered by the patterned mask, the GaN film grows vertically through openings in the patterned mask, and the GaN film then spreads laterally above the patterned mask and across the substrate's surface.

Block 400 represents the step of depositing a ~1350 Å-thick $SiO_2$ film on a suitable substrate or template, such as, but not limited to, an m-plane GaN template grown by MBE on an AlN buffer layer on an m-plane 6H—SiC substrate, wherein the $SiO_2$ film provides the basis for the dielectric mask. Although, in the preferred embodiment, the patterned mask is a dielectric, and the substrate is an m-plane 6H—SiC substrate, other materials may be used as well, such as a metallic material for the patterned mask or sapphire for the substrate.

Block 402 represents the step of depositing a photoresist layer on the $SiO_2$ film and patterning the deposited photoresist layer using conventional photolithography processing steps. In one embodiment, the pattern comprises 35 µm wide stripes separated by 5 µm wide openings.

Block 404 represents the step of etching away any portions of the $SiO_2$ film exposed by the patterned photoresist layer by soaking the substrate in buffered hydrofluoric (HF) acid for two minutes.

Block 406 represents the step of removing remaining portions of the photoresist layer using acetone.

Block 408 represents the step of cleaning the substrate using acetone, isopropyl alcohol, and deionized water.

After drying, the substrate is covered by a patterned mask comprising the patterned $SiO_2$ film having 35 µm wide stripes separated by 5 µm wide openings.

Preferably, the mask is porous. Moreover, the mask may be either uniform, as in the deposition and patterning of a dielectric layer; or inhomogeneous, as in the case of the deposition of a thin, porous metallic or ceramic mask. The mask may be deposited by a variety of in situ or ex situ techniques.

The following Blocks represent the steps of performing a lateral epitaxial overgrowth of the GaN film off the substrate using HVPE, wherein the GaN film nucleates only on portions of the substrate exposed by the patterned mask, the GaN film grows vertically through openings in the patterned mask, and the GaN film then spreads laterally above the patterned mask and across the substrate's surface, eventually converging with adjacent GaN stripes. The lateral epitaxial overgrowth utilizes reduced growth pressures of approximately atmospheric pressure (760 Torr) and a carrier gas containing a fraction of hydrogen. The growth conditions for the lateral growth process are very similar to those described above for high-quality planar m-plane GaN growth via HVPE.

These steps, and the growth parameters therefor, are described in more detail in the co-pending and commonly-assigned International Application No. PCT/US03/21916, entitled "GROWTH OF PLANAR, NON-POLAR A-PLANE GALLIUM NITRIDE BY HYDRIDE VAPOR PHASE EPITAXY," filed on Jul. 15, 2003, by Benjamin A. Haskell, Paul T. Fini, Shigemasa Matsuda, Michael D. Craven, Steven P. DenBaars, James S. Speck, and Shuji Nakamura, which application claims priority to co-pending and commonly-assigned U.S. Provisional Patent Application Ser. No. 60/433,844, entitled "TECHNIQUE FOR THE GROWTH OF PLANAR, NON-POLAR A-PLANE GALLIUM NITRIDE BY HYDRIDE VAPOR PHASE EPITAXY," filed on Dec. 16, 2002, by Benjamin A. Haskell, Paul T. Fini, Shigemasa Matsuda, Michael D. Craven, Steven P. DenBaars, James S. Speck, and Shuji Nakamura, and U.S. Provisional Patent Application Ser. No. 60/433,843, entitled "GROWTH OF REDUCED DISLOCATION DENSITY NON-POLAR GALLIUM NITRIDE BY HYDRIDE VAPOR PHASE EPITAXY," filed on Dec. 16, 2002, by Benjamin A. Haskell, Michael D. Craven, Paul T. Fini, Steven P. DenBaars, James S. Speck, and Shuji Nakamura, ALL OF which applications are incorporated by reference herein.

Block 410 represents the step of loading the substrate into a reactor.

Block 412 represents the step of evacuating the reactor and backfilling the reactor with purified nitrogen (N$_2$) gas to reduce oxygen levels therein. This step is frequently repeated to further reduce residual oxygen levels within the reactor.

Block 414 represents the step of heating the reactor to a growth temperature of approximately 1040° C., with a mixture of H$_2$, N$_2$, and NH$_3$ flowing into a growth chamber at a reduced pressure. In the preferred embodiment, the desired deposition pressure is below atmospheric pressure (760 Torr), and is generally less than 300 Torr. More specifically, the desired deposition pressure may be restricted to a range of 5–100 Torr, and may be set to 76 Torr.

Block 416 represents the step of initiating a gaseous hydrogen chloride (HCl) flow to a gallium (Ga) source to begin growth of the m-plane GaN film directly on the substrate without the use of any low-temperature buffer or nucleation layers. Conventional metal source HVPE involves an in situ reaction of a halide compound, such as (but not limited to), gaseous HCl with the metallic Ga at a temperature in excess of 700° C. to form gallium monochloride (GaCl).

Block 418 represents the step of transporting the GaCl to the substrate by a carrier gas that includes at least a fraction of hydrogen (H$_2$) in one or more of the gas streams in the reactor. In one embodiment, the carrier gas may be predominately hydrogen, while in other embodiments, the carrier gas comprises a mixture of hydrogen and nitrogen, argon, helium or other inert gases. Either in transport to the substrate, at the substrate, or in an exhaust stream, the GaCl reacts with the NH$_3$ to form the GaN film. Reactions that occur at the substrate have the potential to yield the GaN film on the substrate, thereby resulting in crystal growth. Typical V/III ratios are 1–50 for this process. Note that the NH$_3$/HCl ratio need not equal the V/III ratio due to supplemental HCl injection downstream of the Ga source or incomplete reaction of HCl with the Ga source.

Block 420 represents, after a desired growth time has elapsed, the step of interrupting the gaseous HCl flow, reducing the reactor's temperature to room temperature. The reactor will generally be held at low pressure until the substrate has dropped below 600° C., but the reactor pressure may optionally be returned to atmospheric pressure at this time. The interrupting step further comprises including NH$_3$ in a gas stream to prevent decomposition of the GaN film during the reduction of the reactor's temperature.

Preferably, the above process steps create lateral epitaxial overgrowth of a planar, m-plane GaN film off the template. Moreover, the above process steps are used to manufacture a free-standing m-plane GaN film or substrate. However, the present invention may encompass the deposition of any (Al,B,In,Ga)N films. Moreover, devices manufactured using this method include laser diodes, light-emitting diodes and transistors.

Experimental Results

In a demonstration of the present invention, m-plane GaN templates were grown on m-plane 6H—SiC using AlN buffer layers grown by MBE. A ~1350 Å-thick SiO$_2$ layer was then deposited on the GaN template surface. Conventional photolithographic techniques and wet etching in a 5% HF solution were used to pattern an array of parallel stripe openings in the SiO$_2$ layer. In the initial experiments, these parallel stripes were oriented along either the GaN [0001] or [11$\bar{2}$0] directions. After ultrasonic cleaning of the wafers with acetone and isopropanol, the patterned wafers were loaded into a horizontal HVPE reactor. The samples were heated to deposition temperatures ranging from 850 to 1075° C. in an ambient of 52% N$_2$, 42% H$_2$, and 6% NH$_3$ at a pressure of 62.5 Torr. Once the samples had reached the desired growth temperature, the gas flow into the reactor was changed to 38% N$_2$, 57% H$_2$, and the balance NH$_3$ and HCl with a V:III ratio of 13.1. After the desired growth time, the HCl flow into the reactor was halted and the furnace shut off, with the samples being cooled to below 600° C. at the reduced pressure with NH$_3$ present. Below 600° C., the ambient was switched exclusively to N$_2$ and the samples were cooled to room temperature.

Figure 5A:
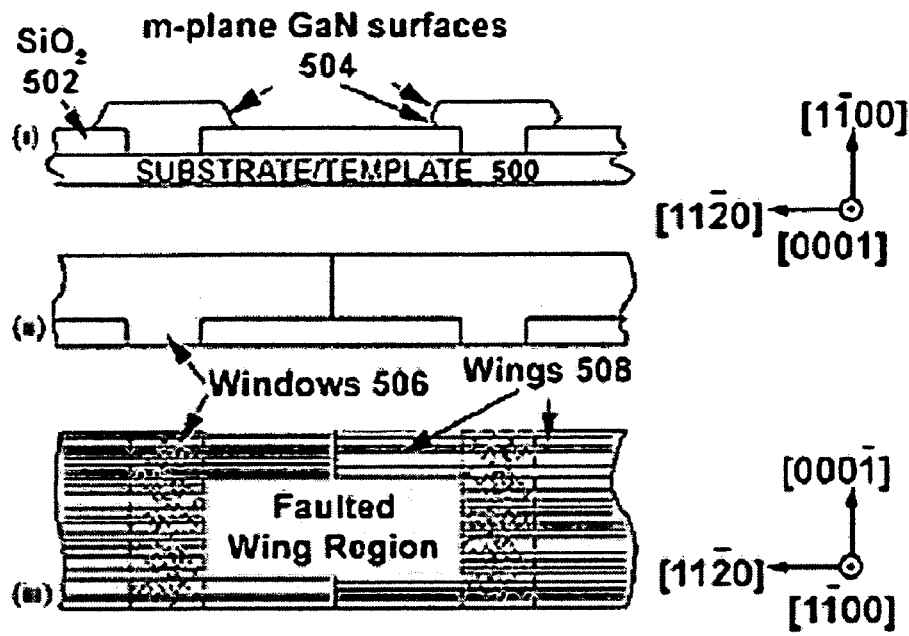
FIG. 5(a) is a schematic of the m-plane GaN lateral epitaxial overgrowth process using <0001>-oriented SiO$_2$ stripes.
Figure 5B:
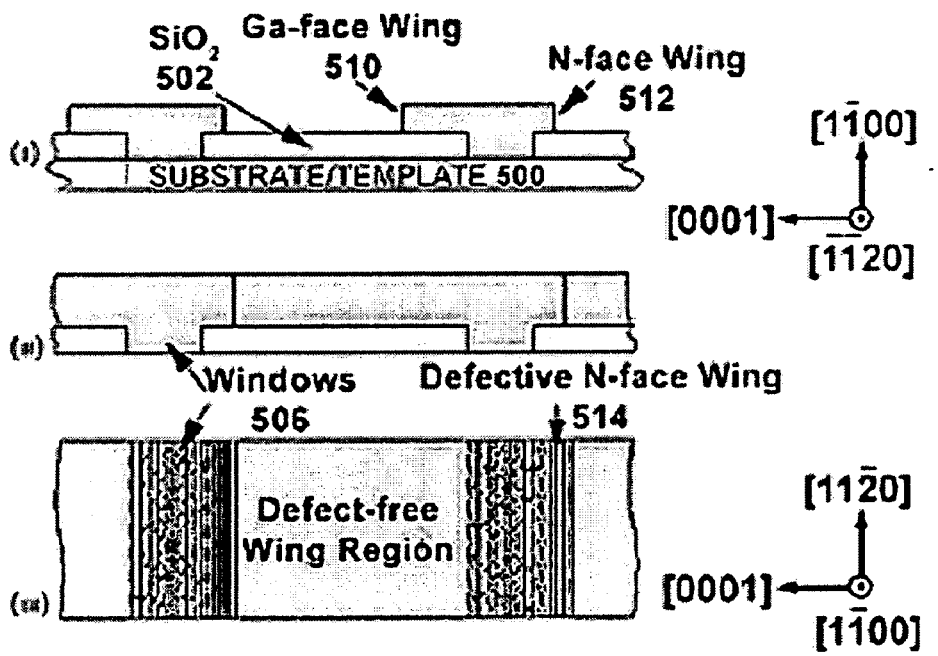
FIG. 5(b) is a schematic of the m-plane GaN lateral growth process using <11$\bar{2}$0>-oriented SiO$_2$ stripes.

A schematic of the lateral epitaxial overgrowth process using parallel mask stripes oriented along the <0001> direction is shown in FIG. 5(*a*), which includes a substrate/template 500, SiO$_2$ mask 502 and m-plane GaN surfaces 504. During the growth process, the m-plane GaN film 504 grows only from the regions of exposed substrate/template material 500 and spreads laterally above the mask 502 and across the substrate 500 surface. The laterally growing GaN film 504 will exhibit reduced threading dislocation densities in the wing regions 508 compared to the GaN 504 growing vertically from the exposed window 506 region. FIG. 5(*b*) shows the corresponding process for a mask geometry 502 of parallel stripes aligned instead along the <11$\bar{2}$0> direction. In this geometry, two asymmetrical wings will form. The Ga-face wing 510 will be free of both threading dislocations and stacking faults, while the N-face wing 512 and 514 will be free of threading dislocations but not stacking faults. In both cases, threading dislocations will be eliminated in the overgrown material 504 even if they are present in the window material.

Figure 6A:
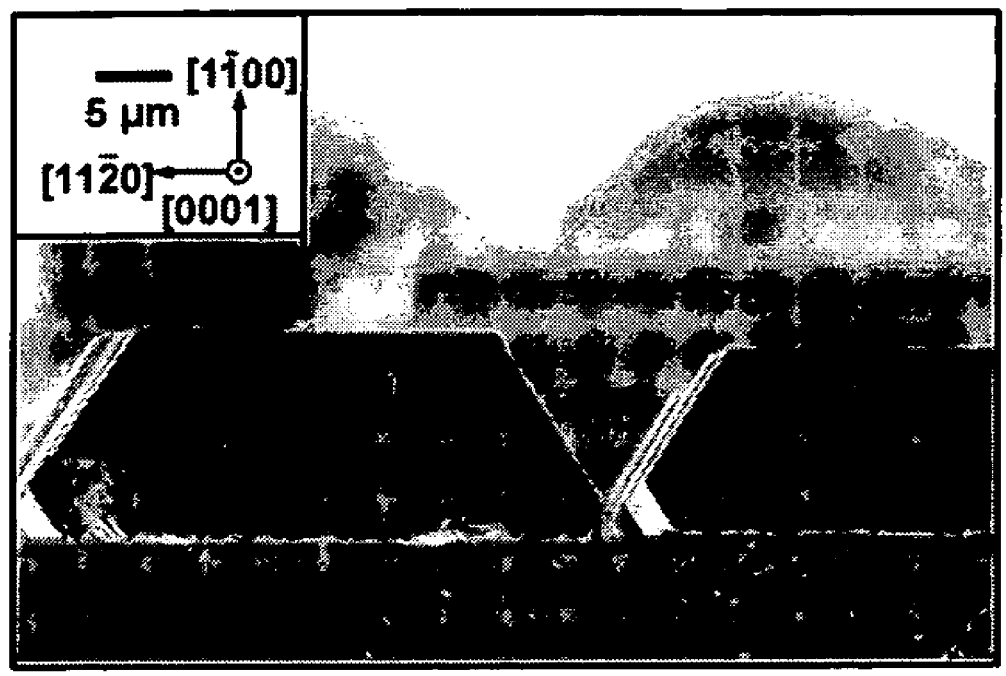
FIG. 6(a) is an inclined cross section view of <0001>-oriented m-plane GaN lateral epitaxial overgrowth stripes.
Figure 6B:
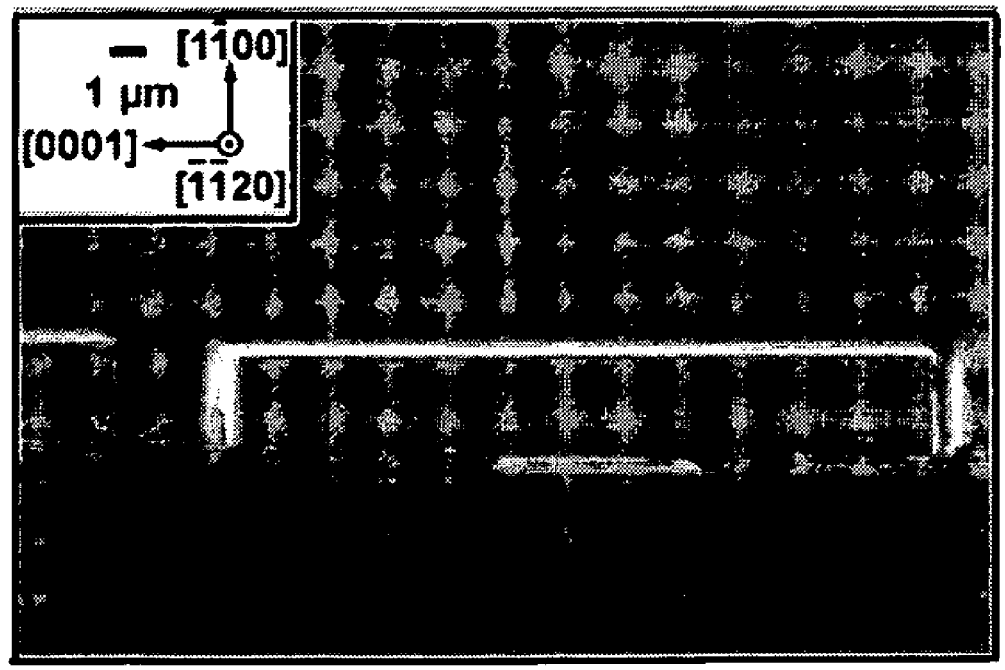
FIG. 6(b) is a cross section view of <11$\bar{2}$0>-oriented GaN stripes.

An example of several m-plane GaN stripes grown by this technique is shown in FIG. 6(*a*). These stripes have grown through ~5 µm-wide windows in a SiO$_2$ mask oriented along the <0001> direction and have spread laterally to a width of approximately 40 µm. If this growth had been continued for a sufficient time, this stripes would have converged with adjacent stripes to form a continuous m-plane GaN surface, such as the one shown in FIG. 7(*a*). The coalesced film will have lower dislocation densities in the overgrown regions due to blocking and bending of dislocations through the transition from vertical to lateral growth. This reduced defect density is confirmed by panchromatic cathodoluminescence (CL) in FIG. 7(*b*). The CL image reveals the dark, defective window regions and brighter, laterally overgrown wing regions. The overgrown material exhibits more intense luminescence due to the reduced dislocation density in the overgrown material. Thus, the invention offers an effective means of reducing the structural defect density in nonpolar m-plane GaN films. Dislocation bending can be further observed in the cross-sectional SEM and CL images in FIGS. 7(*e*) and (*f*).

Figures 7A, 7B:
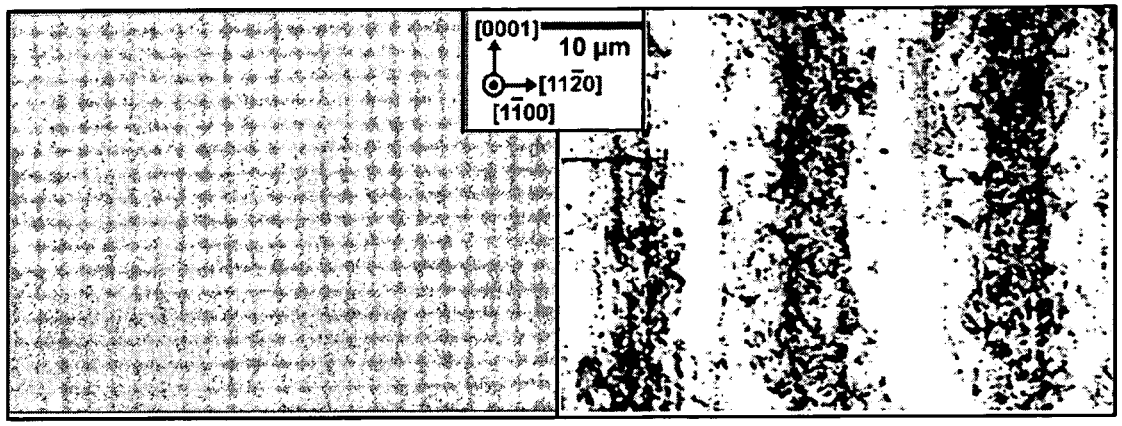
FIGS. 7(a) and 7(c) are plan view scanning electron microscopy images of coalesced lateral epitaxial overgrowth stripes grown from <0001> and <11$\bar{2}$0>-oriented stripes, respectively.
FIGS. 7(b) and 7(d) are corresponding cathodoluminescence images of the surfaces shown in FIGS. 7(a) and 7(c), revealing the window and wing regions.
Figures 7C, 7D:
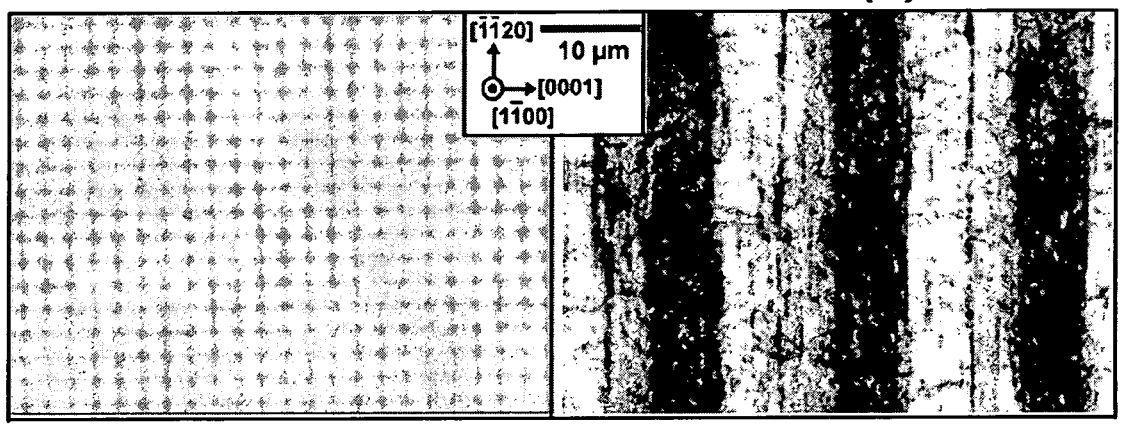
Figures 7E, 7F:
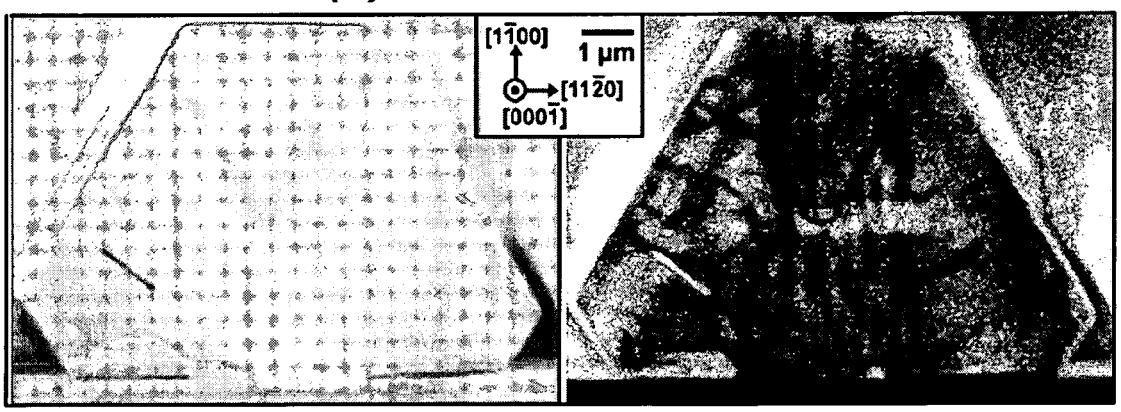
FIG. 7(e) is a cross sections SEM image of an m-plane GaN stripe oriented along the <0001> direction.
FIG. 7(f) is the CL image corresponding to the stripe shown in FIG. 7(e).

A second example of m-plane GaN LEO stripes is shown in FIG. 6(*b*), in this case using parallel SiO$_2$ stripes oriented along the <11$\bar{2}$0> direction. In contrast to the stripes shown in FIG. 6(*a*), stripes oriented along the <11$\bar{2}$0> direction exhibit vertical c-plane sidewalls and asymmetrical lateral growth rates. The Ga-face wing will be free of dislocations and stacking faults, while the N-face wing will be free of dislocations only. A smooth, coalesced film grown with <11$\bar{2}$0>-oriented stripes is shown in FIG. 7(*c*). The reduced defect densities are again apparent in the plan view CL image shown in FIG. 7(*d*), with the defective window regions appearing dark and the reduced defect density wing regions being bright. Note that even through the N-face wing contains stacking faults, its luminescence is much greater than that of the window region as stacking faults do not significantly detract from radiative recombination efficiency in GaN.

Figure 8A:
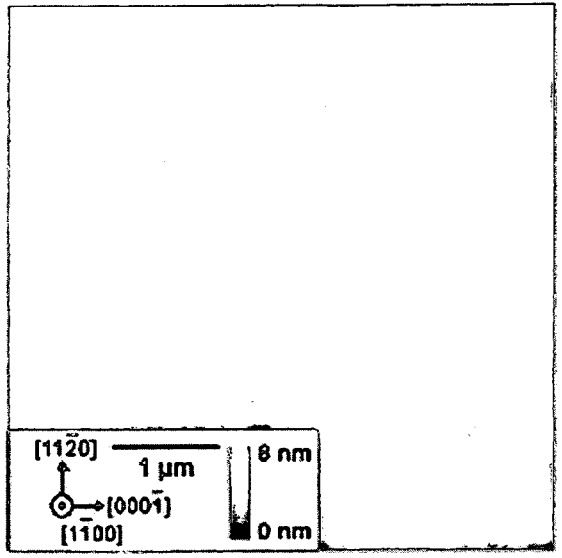
Figure 8B:
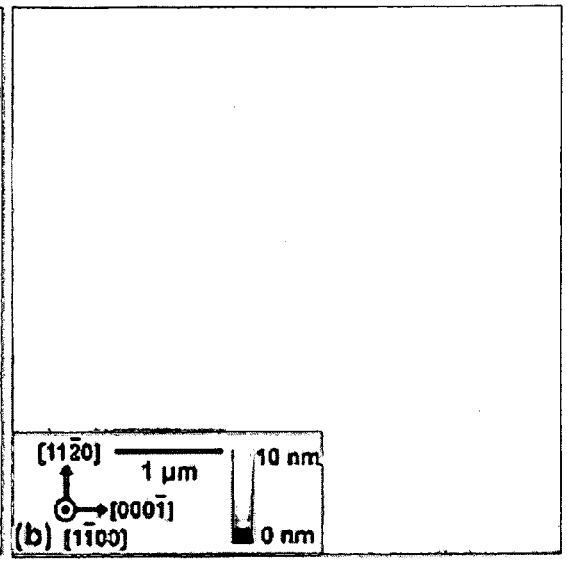
Figure 8C:
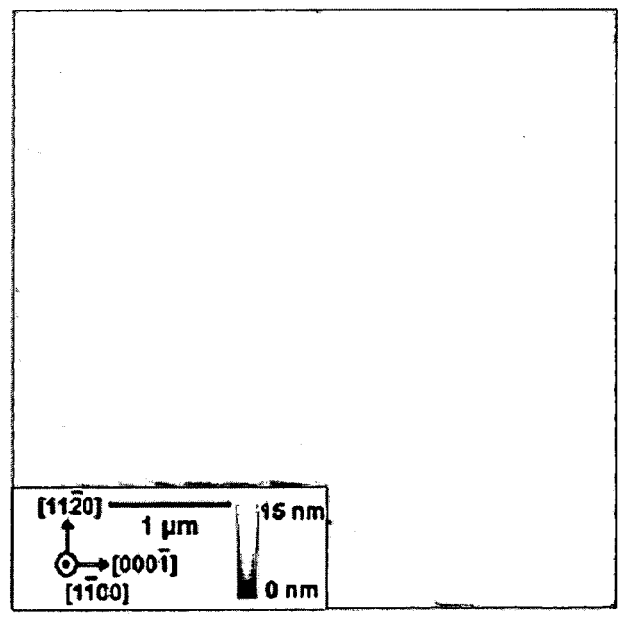

FIGS. 8(a), 8(b) and 8(c) offer a comparison of local surface morphology with and without the defect reduction technique offered by the present invention. FIG. 8(a) shows an AFM image of the smoothest m-plane GaN film that has been grown without any form of defect reduction. This surface is significantly smoother than any surface previously reported in the scientific literature, with an RMS roughness of 8 Å over a 25 µm$^2$ area. The AFM image shown in FIG. 7(b) is also a 5×5 µm image of an m-plane GaN surface, taken from the laterally overgrown region of a sample grown with <0001>-oriented stripes according to the present invention. The scallops due to dislocation terminations have been eliminated, and the surface roughness has been reduced to 6 Å. This roughness is on par with very high-quality polar c-plane GaN films. FIG. 8(c) shows another AFM image of an m-plane GaN films, in this case from one of the laterally overgrown wings of an LEO sample that incorporated parallel SiO$_2$ stripes oriented along the GaN <11$\bar{2}$0> direction. The surface morphology is significantly more uniform, exhibiting a morphology that closely resembles that which is observed in the highest-quality c-plane GaN films. The RMS roughness of this surface is only 5.31 Å, nearly a 34% reduction/improvement compared to the non-LEO surface. Thus, the present invention can be utilized to provide smoother m-plane GaN surfaces, which will lead to higher device quality.

The preferred embodiment of the present inventions for growth of high-quality m-plane GaN and the subsequent defect reduction therein includes:

1. Use of a suitable substrate, such as but not limited to (100) γ-LiAlO$_2$ or (1$\bar{1}$00) SiC (any hexagonal polytype), or a template comprising an m-plane III-N film on a suitable substrate.

2. Use of a fraction of hydrogen as a carrier gas for the GaN deposition stage in one or more of the gas streams in the reactor.

3. Use of a reduced reactor pressure, below 760 Torr, for the GaN growth stage of film deposition.

4. Incorporation of defect reduction techniques involving deposition of a thin mask layer such as a 1300 Å-thick SiO$_2$ mask containing apertures or stripes allowing access to the underlying III-N template layer or substrate.

5. Growth of an m-plane GaN film through the mask layer, which spreads laterally to produce reduced defect density GaN.

As an example, a 1300 Å-thick SiO$_2$ film is deposited on a 500 µm thick polished m-plane SiC substrate that has previously been coated with an m-plane AlN film by MBE. Conventional photolithography processing is used to pattern a photoresist layer comprised of 35 µm-wide stripes separated by 5 µm-wide openings. The wafer is then soaked in buffered hydrofluoric acid for two minutes, completely etching away the exposed SiO$_2$. The remaining photoresist is removed with acetone and the wafer is cleaned in acetone, isopropyl alcohol, and deionized water. After drying, the wafer, which now comprises an m-plane AlN film on an m-plane SiC substrate that is covered by 35 µm-wide SiO$_2$ stripes separated by 5 µm-wide openings, is loaded into the reactor for growth. During the growth process, GaN nucleates only on the exposed AlN and grows vertically through the mask openings. The film then spreads laterally over the SiO$_2$ stripes, eventually converging with adjacent GaN stripes.

Possible Modifications and Variations

The preferred embodiment has described a method for growing planar m-plane GaN and then improving the quality of the m-plane GaN via a lateral overgrowth process. Several potential substrate materials have been proven effective the practice of this invention, including (100) γ-LiAlO$_2$, (1$\bar{1}$00) 4H—SiC, and (1$\bar{1}$00) 6H—SiC. Alternative suitable substrate materials, including, but not limited to, free-standing m-plane GaN, free-standing m-plane AlN, additional polytypes of SiC, miscut m-plane Al$_2$O$_3$, or miscut variants of any of the substrates previously mentioned, may potentially be used in practice of this invention. The substrate for the lateral growth process may also comprise any suitable substrate for the growth of planar m-plane GaN, or any of the above substrates that has been coated with a template layer of GaN, AlN, AlGaN, or other template material. Nucleation layers deposited at either low temperatures or at the growth temperature by a variety of growth techniques may also be used for subsequent lateral overgrowth by HVPE using this technique. It should be noted that the choice of substrates will affect the optimal gas composition during the reactor heating stage. For some substrates, such as LiAlO$_2$, it is preferable to ramp in an atmosphere that includes ammonia, whereas SiC will be negatively affected by ramping with ammonia present. It may also be preferable to ramp to the growth temperature at low pressure, particularly when regrowing on GaN templates. Significant variations in ramp conditions may be made without deviating from the scope of the present invention.

Additionally, a variety of mask materials, mask deposition techniques, and patterning methods may be used in the practice of this invention without significantly altering the results of the invention. Such deposition approaches include, but are not limited to, evaporation of metallic masks (e.g., titanium or tungsten), sputter deposition of dielectric masks including a wide range of oxides and SiN$_x$, and chemical vapor deposition of oxide, nitride, or fluoride masks. The mask may be deposited via an ex situ technique as described above or may be deposited in situ. As an example, within a single three-source HVPE reactor, it is possible to deposit an AlN buffer on an m-SiC substrate, then grow a thin GaN film using the invention described herein, then deposit a thin SiN$_x$ mask layer through with reduced defect density m-plane GaN may be grown. The mask in this instance would consist of irregular islands of SiN$_x$ but would serve the same purpose as a uniform mask prepared through photolithography. Alternatively, a Ti metal film could be evaporated on a free-standing m-plane GaN substrate, loaded into the HVPE growth system, and annealed in NH$_3$ to form a similarly porous mask layer.

Another alternative approach is to etch a pattern into the substrate or template material rather than deposit a patterned mask on the substrate by, for example, reactive ion etching. In such an approach, the depth and width of the trenches in the substrate should be chosen such that the film growing laterally from the unetched plateaus coalesce before the GaN growing from the bottom of the trenches reaches the top of the trenches. This technique, known as cantilever epitaxy, has been demonstrated for polar c-plane GaN growth, and should be compatible with the present invention. The upper surfaces of the substrate or template pillars that remain may be left uncoated, as in cantilever epitaxy, or may be coated with a mask material to encourage growth from the exposed sidewalls, as in sidewall lateral epitaxial overgrowth.

The geometry of the dielectric mask described in the significantly affects the behavior of the laterally-growing film. In establishing the validity of the present invention, masks containing stripes with various orientations relative to the substrate were used. While the growth behavior from each shape opening differs, it has been shown that the choice of mask geometry does not fundamentally alter the practice of this invention. Thus, any mask containing some regions where GaN nucleation is preferred and some regions where GaN nucleation is discouraged is acceptable, irrespective of geometry.

Reactor geometry and design may affect the practice of this invention. The growth parameters required for the successful lateral overgrowth of non-polar GaN may vary from reactor to reactor. Such variations do not fundamentally alter the general practice of this invention.

Additionally, while in general it is desirable to continue the lateral growth process to the point of film coalescence, coalescence is not a requirement for the practice of this invention. The present inventors have envisioned a number of applications in which uncoalesced laterally-overgrown nonpolar GaN stripes or pillars would be highly desirable. Therefore, this disclosure applies to both coalesced and uncoalesced laterally-overgrown non-polar GaN films.

The present invention has focused on the growth of planar m-plane GaN by HVPE. However, this invention is also applicable to the growth of m-plane III-N alloys, including, but not limited to, InGaN and AlGaN. The incorporation of a fraction of Al, In, or B in the nonpolar GaN films does not fundamentally alter the practice of the invention. In general, in the above discussion, any mention of "GaN" may be replaced by the more general nitride composition $Al_xIn_yGa_zB_nN$, in which $0 \leq x \leq 1$, $0 \leq y \leq 1$, $0 \leq z \leq 1$, $0 \leq n \leq 1$, and $x+y+z+n=1$. Also, additional dopants, such as, but not limited to, Si, Zn, Mg, and Fe, can be incorporated into the films described in this invention without deviating from its scope.

The practice of this invention may include multiple growth steps at varying temperatures and or pressures, or having different nitride compositions. Such multi-step growth processes are fundamentally compatible the invention described herein.

Furthermore, this invention has described a growth technique utilizing HVPE. Our research on the growth of non-polar III-N films has firmly established that using simple modifications, the techniques for lateral overgrowth of GaN described herein may be adapted to the growth of m-GaN by MOCVD as well.

Advantages and Improvements

This invention represents the first known reports of planar, high-quality nonpolar m-plane GaN and of lateral overgrowth of m-plane GaN by HVPE. The literature contains no previous reports of lateral growth of m-plane GaN by any technique.

The application of low-pressure growth utilizing a majority fraction of hydrogen carrier gas enabled for the first time the growth of planar m-plane GaN films by HVPE. The present invention expands on this discovery by allowing significant defect reduction and film quality improvement compared to nonpolar GaN films grown heteroepitaxially on substrates. Such reduced defect density nonpolar GaN will provide for improvements in the electronic, optoelectronic, and electromechanical devices that are subsequently grown on the template films grown by this technique. The laterally overgrown films described herein further provide an excellent means of reducing the dislocation density in thick non-polar GaN films that can be debonded to form free-standing substrates.

REFERENCES

The following references are incorporated by reference herein:

1. R. R. Vanfleet, et al., "Defects in m-face GaN films grown by halide vapor phase epitaxy on $LiAlO_2$," Appl. Phys. Lett., 83 (6) 1139 (2003).

2. P. Waltereit, et al., "Nitride semiconductors free of electrostatic fields for efficient white light-emitting diodes," Nature (406) 865 (2000).

3. Y. Sun et al., "In surface segregation in M-plane (In,Ga)N/GaN multiple quantum well structures," Appl. Phys. Lett. 83 (25) 5178 (2003).

4. Gardner et al., "Polarization anisotropy in the electroluminescence of m-plane InGaN-GaN multiple-quantum-well light-emitting diodes," Appl. Phys. Lett. 86, 111101 (2005).

5. Chitnis et al., "Visible light-emitting diodes using a-plane GaN-InGaN multiple quantum wells over r-plane sapphire," Appl. Phys. Lett. 84 (18) 3663 (2004).

6. Chakraborty et al., "Nonpolar InGaN/GaN emitters on reduced-defect lateral epitaxially overgrown a-plane GaN with drive-current-independent electroluminescence emission peak," Appl. Phys. Lett. 85 (22) 5143 (2004).

7. Craven et al., "Threading dislocation reduction via laterally overgrown nonpolar (11–20) a-plane GaN," Appl. Phys. Lett. 81 (7) 1201 (2002).

8. Haskell et al., "Defect reduction in (11–20) a-plane gallium nitride via lateral epitaxial overgrowth by hydride vapor phase epitaxy," Appl. Phys. Lett. 83 (4) 644 (2003).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of growing planar m-plane gallium nitride (GaN) films, comprising:
    (a) performing a direct growth of a planar m-plane GaN film by hydride vapor phase epitaxy; and
    (b) performing a lateral epitaxial overgrowth (LEO) off of a surface of the direct growth resulting in a top surface that is a planar m-plane GaN film.

2. The method of claim 1, wherein the planar m-plane GaN film is produced for use as a substrate for polarization-free device growth.

3. The method of claim 1, wherein the direct growth of the planar m-plane GaN film is performed on a substrate comprising m-plane SiC, (100)γ-$LiAlO_2$, or a substrate covered by an m-plane (In,Al,Ga,B)N template layer.

4. The method of claim 1, wherein the performing step (a) further comprises:
    (1) loading a substrate into a reactor;
    (2) heating the reactor to a growth temperature, with a mixture of ammonia ($NH_3$), hydrogen ($H_2$) and nitrogen ($H_2$) flowing into a growth chamber;
    (3) reducing the reactor's pressure to a desired deposition pressure, wherein the desired deposition pressure is below atmospheric pressure;

(4) initiating a gaseous hydrogen chloride (HCl) flow to a gallium (Ga) source to begin growth of the planar m-plane GaN film directly on the substrate, wherein the gaseous HCl reacts with the Ga to form gallium monochloride (GaCl);

(5) transporting the GaCl to the substrate using a carrier gas that includes at least a fraction of hydrogen ($H_2$), wherein the GaCl reacts with ammonia ($NH_3$) at the substrate to form the planar m-plane GaN film; and (6) after a desired growth time has elapsed, interrupting the gaseous HCl flow, returning the reactor's pressure to atmospheric pressure, and reducing the reactor's temperature to room temperature.

5. The method of claim 4, wherein the substrate is coated wit a nucleation layer deposited either at low temperatures or at the growth temperature.

6. The method of claim 4, further comprising nitridating the substrate by adding anhydrous ammonia ($NH_3$) to a gas stream in the reactor.

7. The method of claim 4, wherein the interrupting step (6) further comprises including anhydrous ammonia ($NH_3$) in a gas stream to prevent decomposition of the GaN film during the reduction of the reactor's temperature.

8. The method of claim 4, wherein the interrupting step (6) further comprises cooling the substrate at a reduced pressure.

9. The method of claim 1, wherein the performing step (b) further comprises:

(1) patterning a mask deposited on the surface of the direct growth; and (2) performing a lateral epitaxial overgrowth off the surface of the direct growth using hydride vapor phase epitaxy, wherein GaN nucleates only on portions of the surface of the direct growth not covered by the patterned mask, the GaN grows vertically through openings in the patterned mask, and the GaN then spreads laterally above the patterned mask and across the surface of the direct growth.

10. The method of claim 9, wherein the lateral epitaxial overgrowth utilizes growth pressures of approximately atmospheric pressure or below, and a carrier gas containing a fraction of hydrogen.

11. The method of claim 10, wherein the carrier gas is predominantly hydrogen.

12. The method of claim 11, wherein the carrier gas comprises a mixture of hydrogen and nitrogen, argon, or helium.

13. The method of claim 9, wherein the lateral epitaxial overgrowth reduces threading dislocations and defect densities in the planar m-plane GaN film.

14. The method of claim 9, wherein the patterned mask is comprised of a metallic material or a dielectric material.

15. The method of claim 9, wherein the patterning step comprises:

depositing a silicon dioxide ($SiC_2$) film on the surface of the direct growth;

patterning a photoresist layer on the silicon dioxide film;

etching away any portions of the silicon dioxide film exposed by the patterned photoresist layer;

removing remaining portions of the photoresist layer; and cleaning the surface of the direct growth.

16. The method of claim 9, wherein the surface of the direct growth is coated with a nucleation layer deposited at either low temperatures or at the growth temperature.

17. The method of claim 1, wherein the lateral epitaxial overgrowth comprises:

(1) etching pillars or stripes out of the surface of the direct growth; and (2) growing laterally from the pillars or stripes.

18. The method of claim 1, wherein the lateral epitaxial overgrowth comprises:

(1) etching pillars or stripes out of the surface of the direct growth;

(2) masking an upper surface of the pillars or stripes; and (3) growing laterally from exposed portions of the masked upper surface of the pillars or stripes.

19. A device manufactured using the method of claim 1.

* * * * *

UNITED STATES PATENT AND TRADEMARK OFFICE
CERTIFICATE OF CORRECTION

| | | |
|---|---|---|
| PATENT NO. | : 7,208,393 B2 | Page 1 of 1 |
| APPLICATION NO. | : 11/140893 | |
| DATED | : April 24, 2007 | |
| INVENTOR(S) | : Haskell et al. | |

It is certified that error appears in the above-identified patent and that said Letters Patent is hereby corrected as shown below:

Title page, item (63) Related U.S. Application Data, lines 6 and 7, please delete "PCT/US03/21918" and insert --PCT/US03/21916--.

Signed and Sealed this
Twenty-fourth Day of July, 2012

David J. Kappos
*Director of the United States Patent and Trademark Office*